(12) United States Patent
Lee et al.

(10) Patent No.: US 11,094,640 B2
(45) Date of Patent: Aug. 17, 2021

(54) PACKAGE MODULE

(71) Applicant: SAMSUNG ELECTRONICS CO., LTD., Suwon-si (KR)

(72) Inventors: Sangkyu Lee, Suwon-si (KR); Shanghoon Seo, Suwon-si (KR); Jeongho Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/590,960

(22) Filed: Oct. 2, 2019

(65) Prior Publication Data
US 2020/0161248 A1 May 21, 2020

(30) Foreign Application Priority Data
Nov. 20, 2018 (KR) .......... 10-2018-0143303

(51) Int. Cl.
*H01L 23/538* (2006.01)
*H01L 23/31* (2006.01)
(Continued)

(52) U.S. Cl.
CPC .......... *H01L 23/5389* (2013.01); *H01L 21/56* (2013.01); *H01L 23/3128* (2013.01); *H01L 23/49503* (2013.01); *H01L 23/49816* (2013.01); *H01L 23/50* (2013.01); *H01L 23/5226* (2013.01); *H01L 24/06* (2013.01); *H01L 24/09* (2013.01); *H01L 24/12* (2013.01); *H01L 24/48* (2013.01); *H01L 25/0657* (2013.01); *H01L 2224/023* (2013.01);
(Continued)

(58) Field of Classification Search
CPC .................................................. H01L 23/5389
See application file for complete search history.

(56) References Cited

U.S. PATENT DOCUMENTS
2012/0182066 A1  7/2012 Merkle et al.
2017/0309571 A1* 10/2017 Yi .......................... H01L 24/20
(Continued)

FOREIGN PATENT DOCUMENTS
JP          3809053 A     8/2006
KR  10-2011-0031249 A    3/2011
(Continued)

*Primary Examiner* — Moazzam Hossain
*Assistant Examiner* — Mohammad A Rahman
(74) *Attorney, Agent, or Firm* — Sughrue Mion, PLLC

(57) ABSTRACT

A package module includes a core structure including a frame having a penetrating portion, an electronic component disposed in the penetrating portion, and an insulating material covering at least a portion of each of the frame and the electronic component and filling at least a portion of the penetrating portion. The core structure further has a recessed portion in which a stopper layer is disposed on a bottom surface of the recessed portion. A semiconductor chip has a connection pad and is disposed in the recessed portion such that an inactive surface faces the stopper layer. An encapsulant covers at least a portion of each of the core structure and the semiconductor chip, and fills at least a portion of the recessed portion. An interconnect structure is disposed on the core structure and an active surface of the semiconductor chip, and includes a redistribution layer.

20 Claims, 19 Drawing Sheets

(51) Int. Cl.
    *H01L 23/495*     (2006.01)
    *H01L 23/498*     (2006.01)
    *H01L 21/56*     (2006.01)
    *H01L 23/00*     (2006.01)
    *H01L 25/065*     (2006.01)
    *H01L 23/522*     (2006.01)
    *H01L 23/50*     (2006.01)

(52) U.S. Cl.
    CPC ............... *H01L 2224/04105* (2013.01); *H01L 2224/05008* (2013.01); *H01L 2224/12105* (2013.01); *H01L 2924/14* (2013.01); *H01L 2924/15172* (2013.01); *H01L 2924/15182* (2013.01)

(56) References Cited

U.S. PATENT DOCUMENTS

2018/0182691 A1     6/2018     Cho et al.
2018/0197831 A1     7/2018     Kim et al.

FOREIGN PATENT DOCUMENTS

KR     10-2012-0083862 A     7/2012
KR     10-2018-0073371 A     7/2018
KR     10-2018-0082849 A     7/2018

\* cited by examiner

PACKAGE MODULE

CROSS-REFERENCE TO RELATED APPLICATION(S)

This application claims benefit of priority to Korean Patent Application No. 10-2018-0143303 filed on Nov. 20, 2018 in the Korean Intellectual Property Office, the disclosure of which is incorporated herein by reference in its entirety.

BACKGROUND

The present disclosure relates to a package module in which one or more semiconductor chips and one or more electronic components are disposed together in a single package.

With the demand for improvements in performance of information technology (IT) devices, increasingly complex configurations of electronic components have been designed to implement high performance for processing high speed data. In the case of products using a radio frequency (RF), a frequency range has been increased, a bandwidth thereof has been widened, and a multi-band capability has been increasingly used. In such an environment, when a small-sized package or module product includes a component in which mutual interference may occur, such as an application processor chip having a high clock or an RF chip using a high frequency, a structure which may isolate blocks from each other may be required, and also a structure which may effectively dissipate heat generated by chips or components may be required.

SUMMARY

An aspect of the present disclosure is to provide a package module which may be reduced in size and miniaturized even while a plurality of chips and components are included therein, which may effectively prevent electromagnetic interference between different types of blocks when a metal layer, or the like, is appropriately included in a basic structure, and which may have an improved heat dissipation effect.

According to an aspect of the present disclosure, an electronic component may be disposed in a penetrating portion penetrating through a frame, and a semiconductor chip may be disposed in a recessed portion which penetrates a core structure including a frame as a sub-component in blind form, such that a modularized basic structure may be included in a single package, and a metal layer may be formed in various positions in the basic structure of the package module.

According to an aspect of the present disclosure, a package module includes a core structure including a frame having a penetrating portion, an electronic component disposed in the penetrating portion, and an insulating material covering at least a portion of each of the frame and the electronic component and filling at least a portion of the penetrating portion. The core structure further has a recessed portion in which a stopper layer is disposed on a bottom surface of the recessed portion. A semiconductor chip has an active surface on which a connection pad is disposed and an inactive surface opposing the active surface, and is disposed in the recessed portion such that the inactive surface faces the stopper layer. An encapsulant covers at least a portion of each of the core structure and the semiconductor chip, and fills at least a portion of the recessed portion. An interconnect structure is disposed on the core structure and the active surface of the semiconductor chip, and includes a redistribution layer electrically connected to the electronic component and the connection pad.

According to an aspect of the present disclosure, the core structure may further include a first metal layer disposed on a side wall of the penetrating portion, and a second metal layer disposed on a side wall of the recessed portion, and the stopper layer may include a metal material. The second metal layer may extend to the bottom surface of the recessed portion, and the second metal layer may cover at least a portion of the stopper layer. The core structure may further include a backside metal layer disposed on a portion of the insulating material facing away from the interconnect structure, a first metal via penetrating the insulating material and connecting the backside metal layer to the first metal layer, and a second metal via penetrating the insulating material and connecting the backside metal layer to the stopper layer, and the backside metal layer may cover a direct upper region of each of the electronic component and the inactive surface of the semiconductor chip on the insulating material. Accordingly, electromagnetic interference between different types of blocks may be effectively shielded, and a heat dissipation effect may improve.

According to a further aspect of the present disclosure, a package module may include a frame having opposing first and second surfaces, a recessed portion open to the first surface and extending into the frame, a conductor pattern layer disposed on the second surface, and a conductive stopper layer forming a bottom surface of the recessed portion and substantially coplanar with the conductor pattern layer disposed on the second surface. A semiconductor chip has an active surface on which a connection pad is disposed and an inactive surface opposing the active surface, and is disposed in the recessed portion such that the inactive surface faces the conductive stopper layer. A metal layer is disposed on a side wall of the penetrating portion and contacts the conductive stopper layer. An interconnect structure is disposed on the frame and the active surface of the semiconductor chip, and includes a redistribution layer electrically connected to the connection pad.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
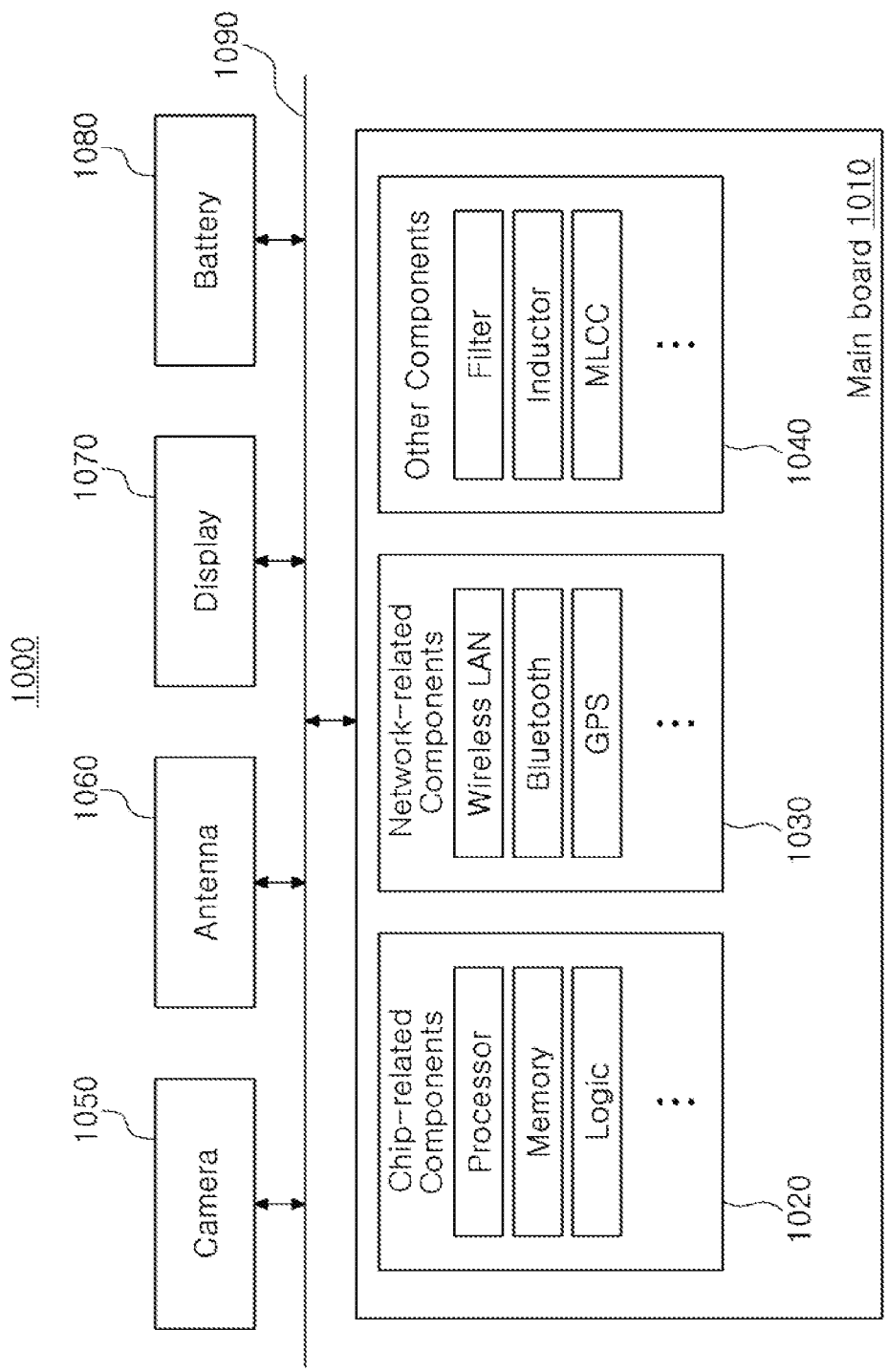
FIG. 1 is a schematic block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
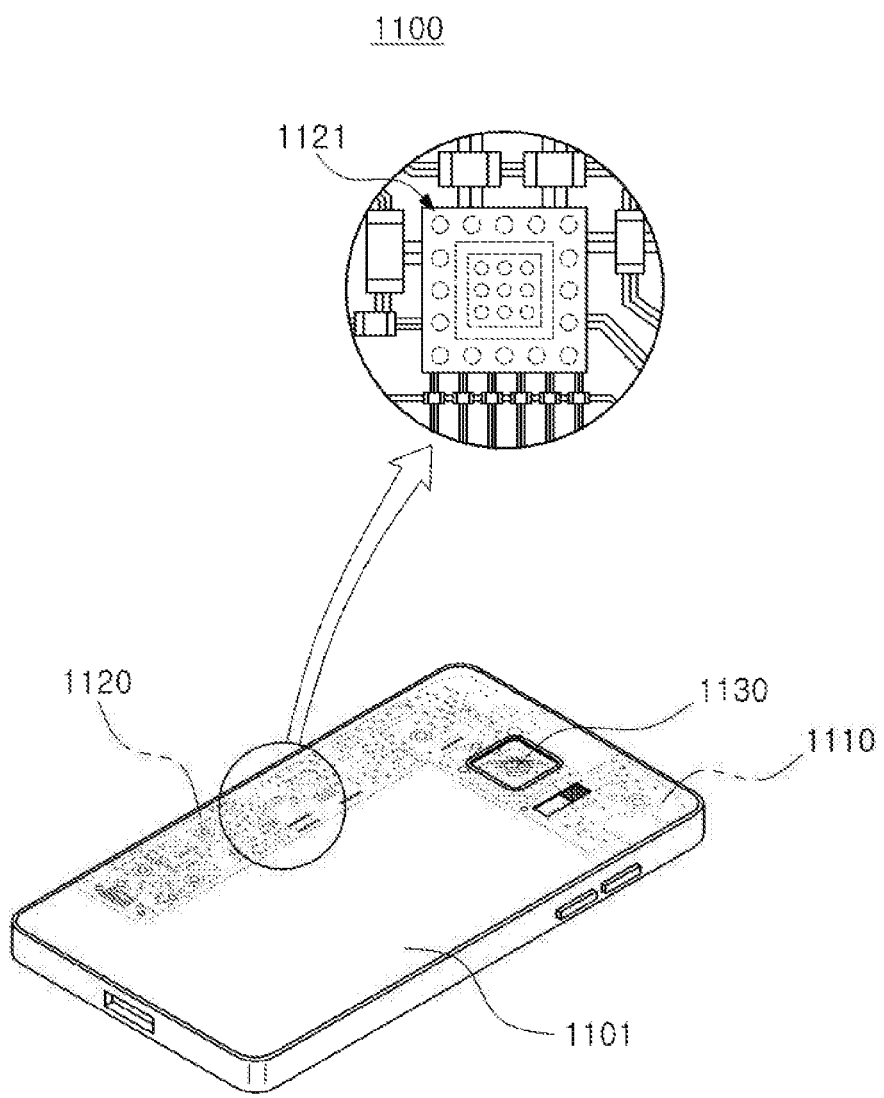
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is used due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is advantageously used.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-in Semiconductor Package

Figure 3A:
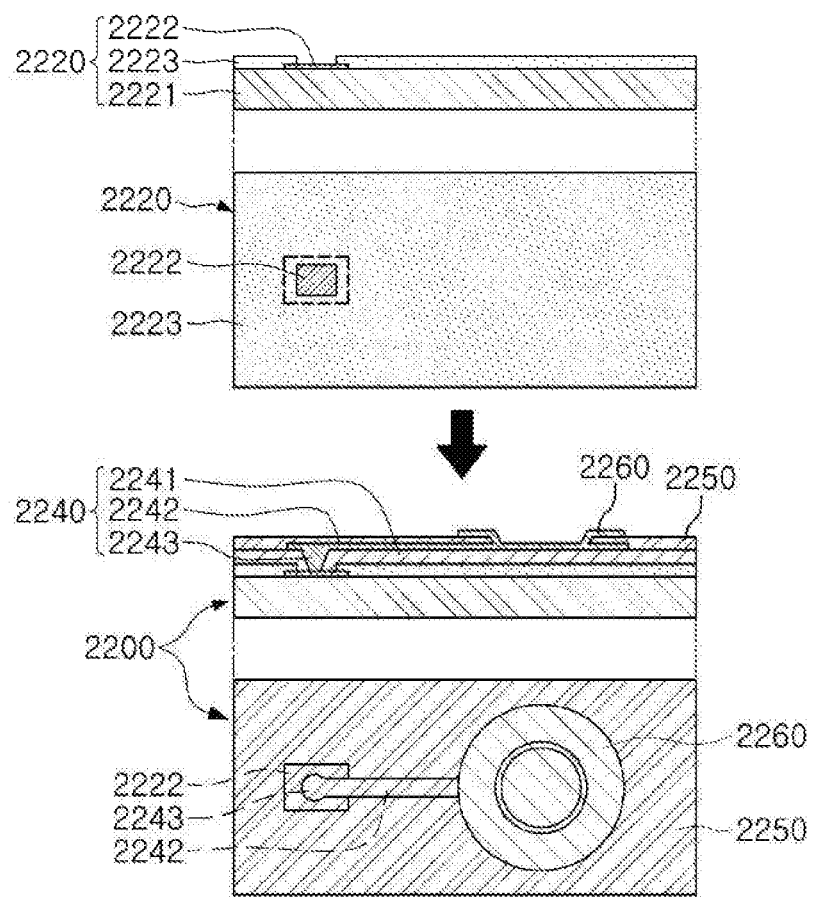
FIGS. 3A and 3B are schematic cross-sectional diagrams illustrating a fan-in semiconductor package before and after a packaging process.
Figure 3B:
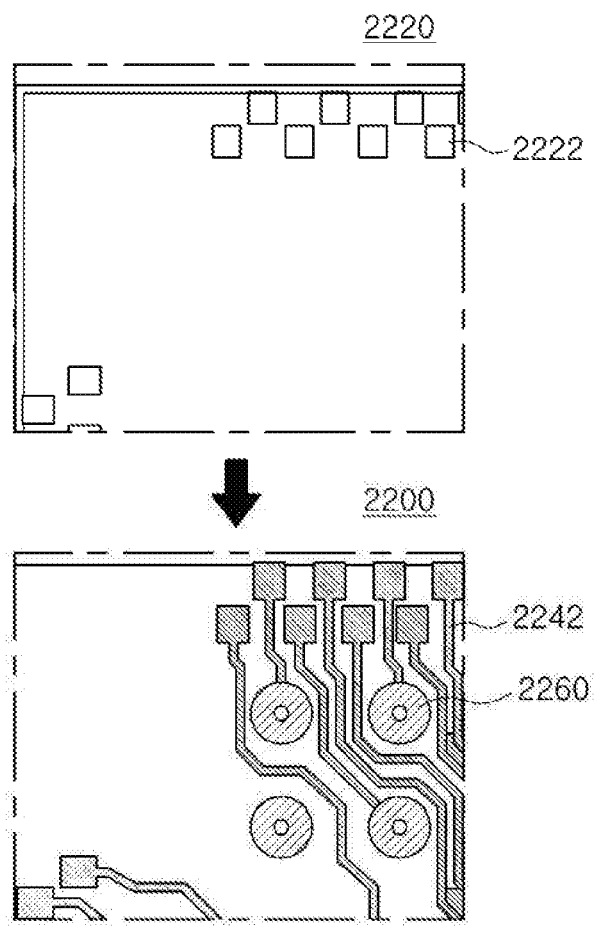

FIGS. 3A and 3B are schematic cross-sectional diagrams illustrating states of a fan-in semiconductor package before and after a packaging process.

Figure 4:
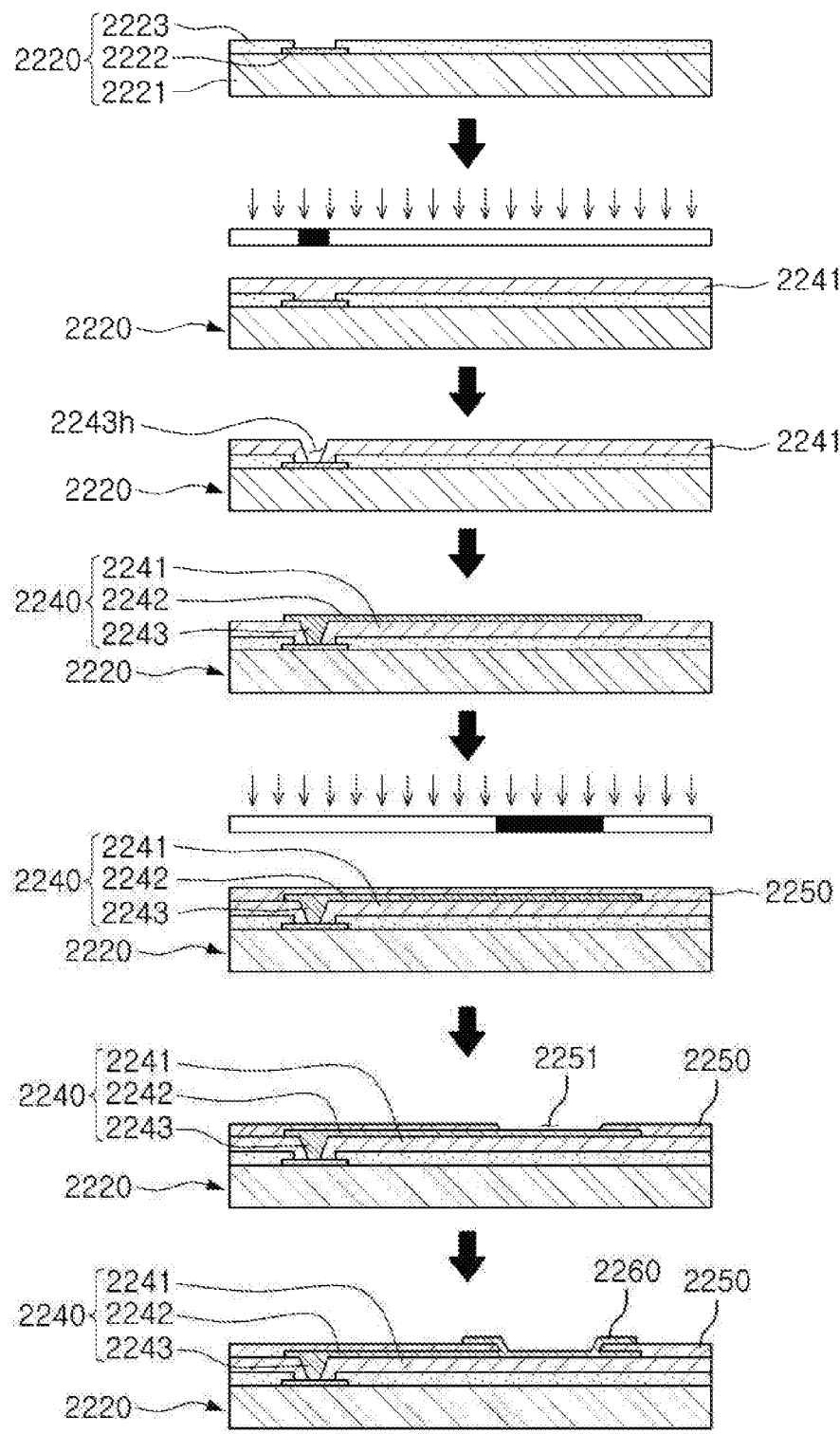
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to the diagrams, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
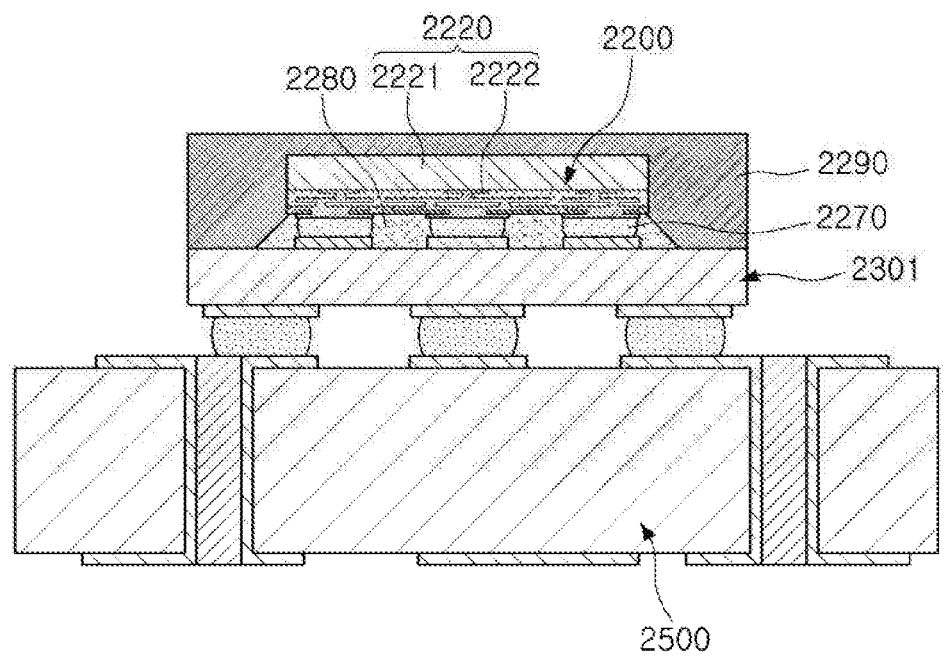
FIG. 5 is a schematic cross-sectional diagram illustrating a fan-in semiconductor package mounted on a printed circuit board and mounted on a mainboard of an electronic device.

FIG. 5 is a schematic cross-sectional diagram illustrating an example in which a fan-in semiconductor package is mounted on a printed circuit board and mounted on a mainboard of an electronic device.

Figure 6:
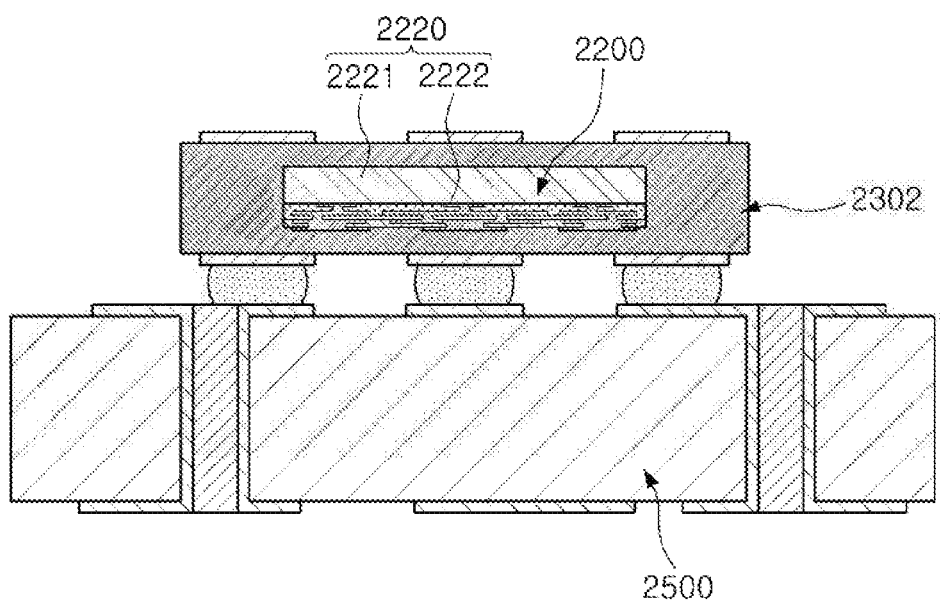
FIG. 6 is a schematic cross-sectional diagram illustrating a fan-in semiconductor package embedded in a printed circuit board and mounted on a mainboard of an electronic device.

FIG. 6 is a schematic cross-sectional diagram illustrating an example in which a fan-in semiconductor package is mounted in a printed circuit board and mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Figure 7:
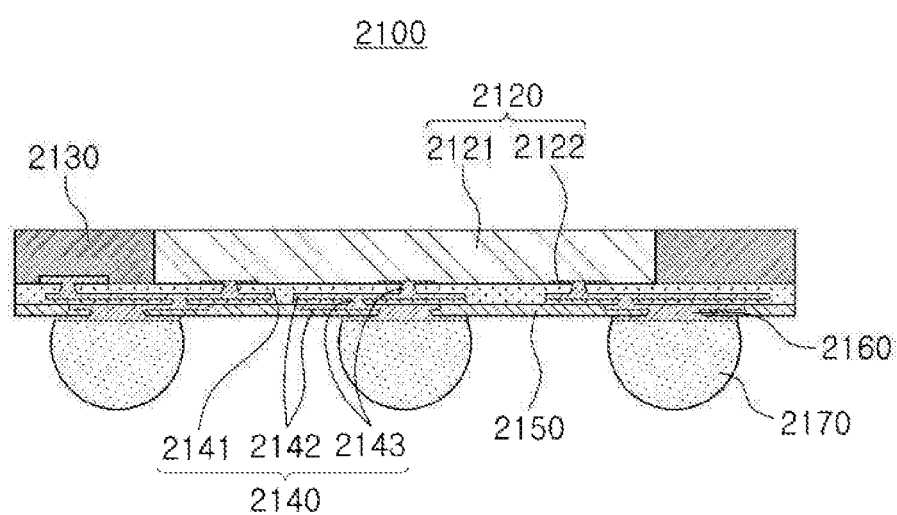
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
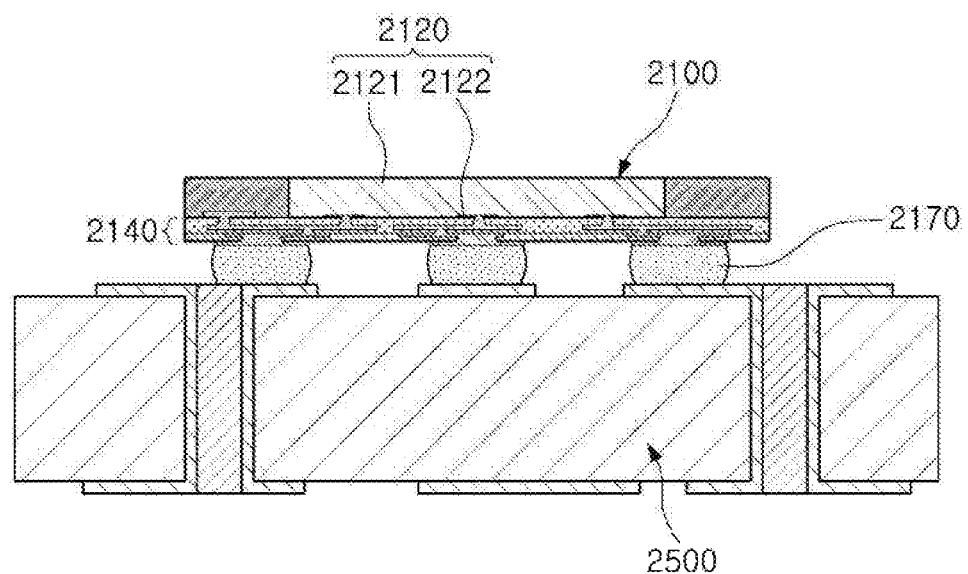
FIG. 8 is a schematic cross-sectional diagram illustrating a fan-out semiconductor package mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

In the description below, a package module is presented which may be reduced in size and miniaturized even while including a plurality of chips and components. The package module may effectively prevent electromagnetic interference between different types of blocks when a metal layer, and the like, is appropriately included in a basic structure in example embodiments. The package module may further have an improved heat dissipation effect.

Package Module

Figure 9:
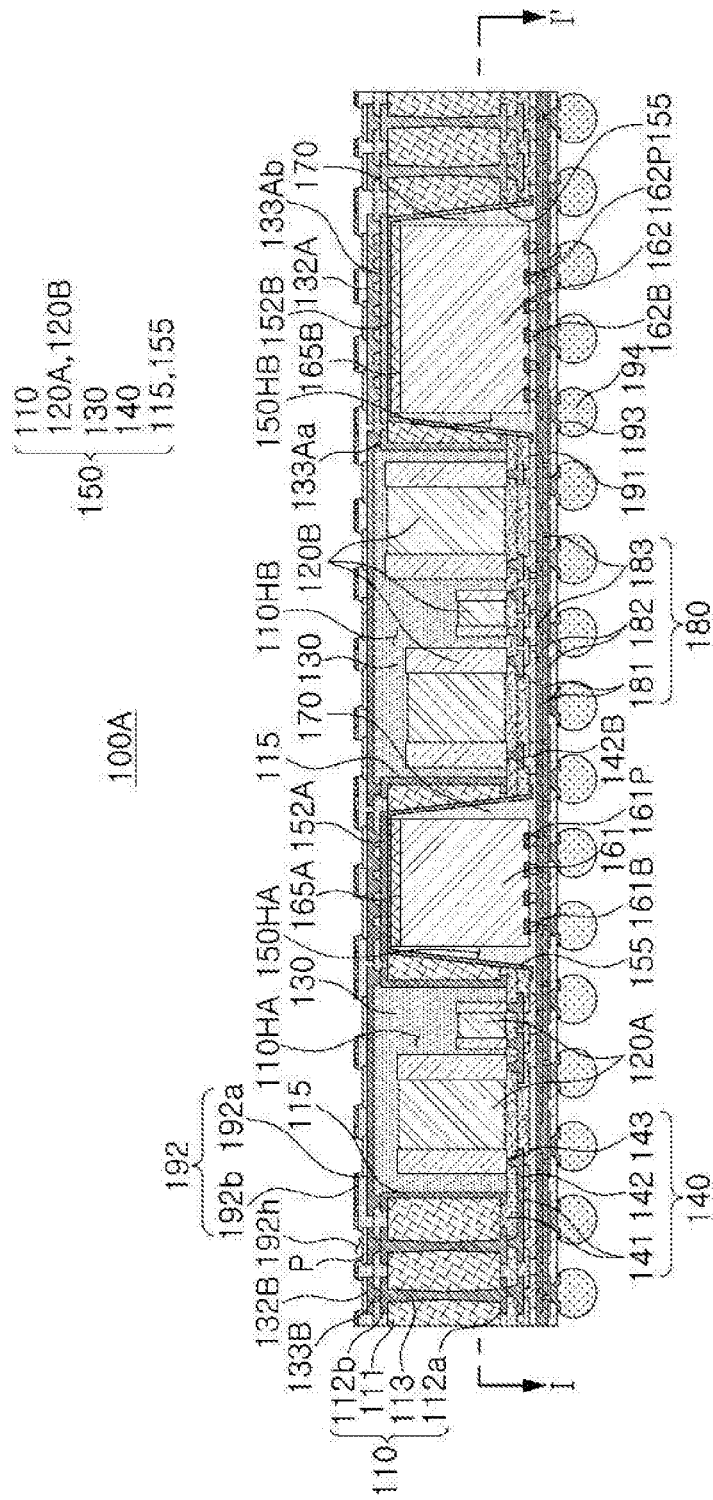
FIG. 9 is a schematic cross-sectional diagram illustrating an example of a package module.

FIG. 9 is a schematic cross-sectional diagram illustrating an example of a package module.

Figure 10:
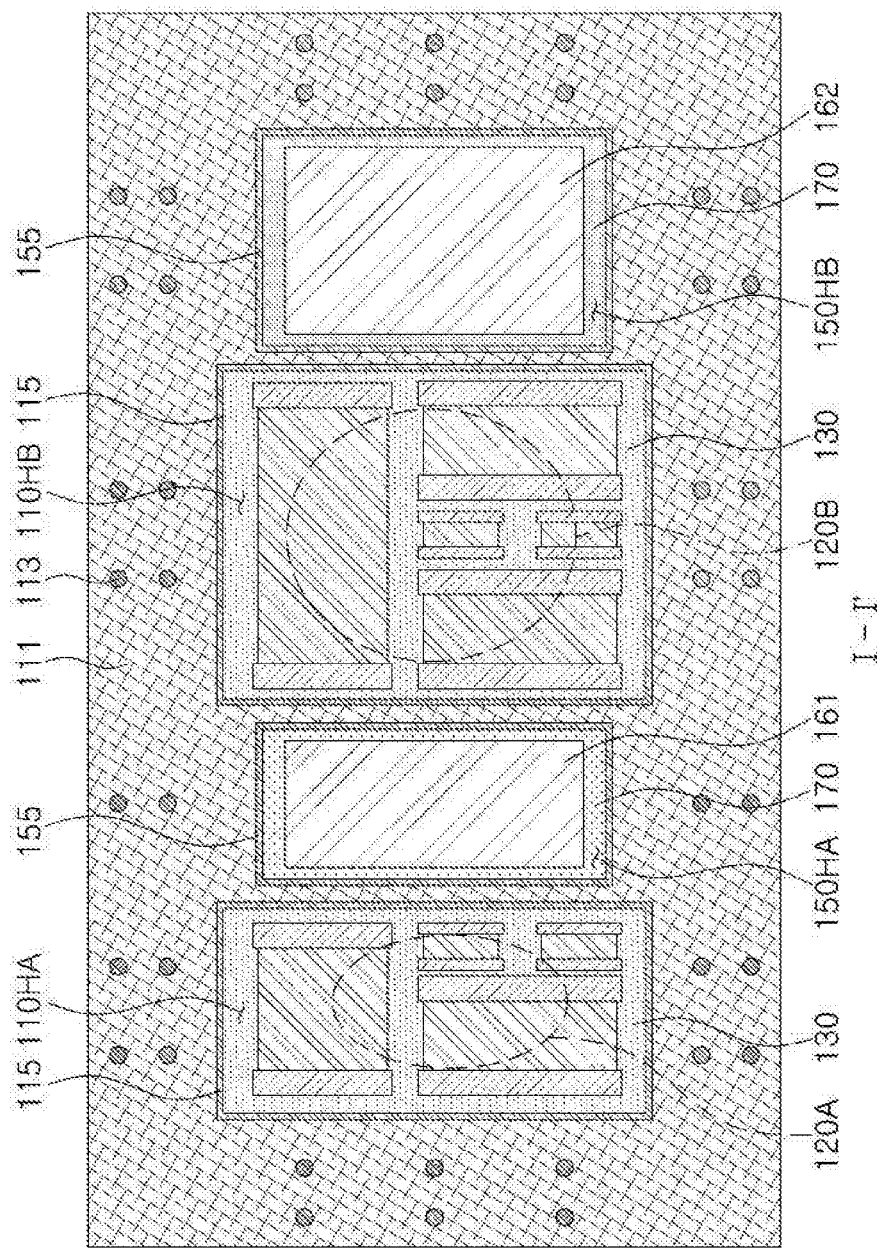
FIG. 10 is a schematic plan diagram illustrating a package module illustrated in FIG. 9 taken along lines I-I'.

FIG. 10 is a schematic plan diagram illustrating a package module illustrated in FIG. 9 taken along lines I-I'.

Referring to the diagrams, a package module 100A in the example embodiment may include a core structure 150 having first and second recessed portions 150HA and 150HB in which first and second stopper layers 152A and 152B are disposed on bottom surfaces thereof, respectively, a first semiconductor chip 161 having a first active surface on which a first connection pad 161P is disposed and a first inactive surface opposing the first active surface, wherein the first inactive surface opposes (e.g., is adjacent to) the first stopper layer 152A, a second semiconductor chip 162 having a second active surface on which a second connection pad 162P is disposed and a second inactive surface opposing the second active surface, wherein the second inactive surface opposes (e.g., is adjacent to) the second stopper layer 152B, first and second adhesive members 165A and 165B attaching the first and second inactive surfaces to the first and second stopper layers 152A and 152B, respectively, first and second connection members 161B and 162B electrically connecting the first and second connection pads 161P and 162P to the redistribution layer 182, a third connection member 142B electrically connecting a wiring layer 142 to the redistribution layer 182, an encapsulant 170 covering at least a portion of each of the core structure 150 and the first and second semiconductor chips 161 and 162, covering side surfaces of each of the first and second connection members 161B and 162B, and filling at least a portion of each of the first and second recessed portions 150HA and 150HB, an interconnect structure 180 disposed on the core structure 150 and the first and second active surfaces, and including a redistribution layer 182 electrically connected to the first and second connection pads 161P and 162P, a first passivation layer 191 disposed on the interconnect structure 180, a second passivation layer 192 disposed on the core structure, a plurality of under bump metals 193 respectively disposed on a plurality of openings of the first passivation layer 191, and a plurality of electrical connector metals 194 disposed on the first passivation layer 191 and respectively connected to the plurality of under bump metals.

The core structure 150 may include a frame 110 having first and second penetrating portions 110HA and 110HB and including a plurality of conductor pattern layers 112a and 112b electrically connected to each other, first and second electronic components 120A and 120B disposed in the first and second penetrating portions 110HA and 110HB, respectively, an insulating material 130 covering at least a portion of each of the frame 110 and the first and second electronic components 120A and 120B and filling at least a portion of each of the first and second penetrating portions 110HA and 110HB, a wiring member 140 disposed on portions of the frame 110 and the first and second electronic components 120A and 120B, and including a wiring layer 142 electrically connected to the plurality of conductor pattern layers 112a and 112b, the first and second electronic components 120A and 120B, and the redistribution layer 182, a first metal layer 115 disposed on side walls of the first and second penetrating portions 110HA and 110HB and extending to at least one surface of the frame 110, a second metal layer 155 disposed on side walls of the first and second recessed portions 150HA and 150HB and extending to one surface of the core structure 150, a backside metal layer 132A disposed on a portion of an insulating material opposing a portion opposing the interconnect structure 180, a first metal via 133Aa penetrating the insulating material 130 and connecting the backside metal layer 132A to the first metal layer 115, a second metal via 133Ab penetrating the insulating material 130 and connecting the backside metal layer 132A to the first and second stopper layers 152A and 152B, a backside conductor pattern layer 132B disposed on portions of the frame 110 and the first and second electronic components 120A and 120B opposing a portion opposing the interconnect structure 180, and a backside conductor via 133B penetrating the insulating material 130 and electrically connecting the backside conductor pattern layer 132B to the plurality of conductor pattern layers 112a and 112b.

In the package module 100A in the example embodiment, the frame 110 having the first and second penetrating portions 110HA and 110HB may be provided, and the first and second electronic components 120A and 120B may be embedded therein, and the first and second semiconductor chips 161 and 162 may be disposed in the first and second recessed portions 150HA and 150HB of the core structure 150 including the frame 110, such that blocks in which different types of components may be distinguished from each other may be formed, and a compact design may be implemented. Thus, the package module may be reduced in size and miniaturized even while including a plurality of chips and components. For example, as the first and second electronic components 120A and 120B along with the first and second semiconductor chips 161 and 162 are disposed in one package and modularized, a gap between a chip and a component may be significantly reduced such that a mounting area in a printed circuit board such as a mainboard may be significantly reduced. Also, as an electrical path between the first and second semiconductor chips 161 and 162 and the first and second electronic components 120A and 120B may be significantly reduced, a noise issue may be resolved. Also, two or more separate and sequential encapsulating processes 170 and 130, in which the first and second electronic components 120A and 120B may be capsulated by the insulating material 130, and the first and second semiconductor chips 161 and 162 may be capsulated by the encapsulant 170, may be performed such that an yield issue of the first and second semiconductor chips 161 and 162 caused by mounting defects of the first and second electronic components 120A and 120B may be resolved, and a foreign object effect from the first and second electronic components 120A and 120B, which may affect the first and second semiconductor chips 161 and 162, may be significantly reduced.

In the package module 100A in the example embodiment, the first and second metal layers 115 and 155 may be disposed on side walls of the first and second penetrating portions 110HA and 110HB and the first and second recessed portions 150HA and 150HB, respectively. Accordingly, electromagnetic interference between different types of blocks may be effectively prevented, and a heat dissipation effect may improve. Also, the first and second semiconductor chips 161 and 162 may have a double-layered shielding layer as the first and second metal layers 115 and 155 are included, and thus, electromagnetic waves may be effectively shielded and blocked. Further, the first and second semiconductor chips 161 and 162 may be included in the first and second recessed portions 150HA and 150HB of the core structure 150, each having a blind cavity form, and the first and second stopper layers 152A and 152B of the first and second recessed portions 150HA and 150HB each may include a metal material, and may be connected to the second metal layer 155, and thus, electromagnetic waves may be effectively shielded in the first and second semiconductor chips 161 and 162, and a heat dissipation effect may improve.

In the package module 100A in the example embodiment, the core structure 150 may include the backside metal layer 132A disposed on the insulating material 130, and the backside metal vias 133Aa and 133Ab connecting the backside metal layer 132A to the first metal layer 115 and the first and second stopper layers 152A and 152B. Accordingly, a metal material covering the first and second inactive surfaces of the first and second semiconductor chips 161 and 162 and direct upper regions of the first and second electronic components 120A and 120B may be included even without a backside process, and thus, electromagnetic interference between different types of blocks may be easily and effectively shielded, and a heat dissipation effect may improve. Further, as the core structure 150 also include the backside conductor pattern layer 132B disposed on the insulating material 130, and the backside conductor via 133B connecting the backside conductor pattern layer 132B to the plurality of conductor pattern layers 112a and 112b, a backside wiring may be designed even without a backside process. The backside metal layer 132A, the backside conductor pattern layer 132B, the backside metal vias 133Aa and 133Ab, and the backside conductor via 133B may be formed before disposing or mounting the first and second semiconductor chips 161 and 162, and thus any defects occurring in the production of the core structure 150 may not affect a yield of the first and second semiconductor chips 161 and 162. In example embodiments, the term "backside" may be determined with reference to the first and second semiconductor chips 161 and 162, and may refer to directions of the first and second inactive surfaces.

The package module 100A in the example embodiment may include the wiring member 140 including the wiring layer 142 which may preferentially redistribute the first and second electronic components 120A and 120B on the frame 110 as a sub-component of the core structure 150, and then may include the first and second semiconductor chips 161 and 162 by forming the first and second recessed portions 150HA and 150HB penetrating the wiring member 140. Thus, when the wiring member 140 is disposed in the core structure 150 before other components, a material of the insulating layer 141 of the wiring member 140 may be selected regardless of the first and second semiconductor chips 161 and 162. For example, a non-photosensitive insulating material including an inorganic filler such as an Ajinomoto build-up film (ABF), and the like, rather than a photosensitive material (PID), may be used as a material of the insulating layer 141. As the film type non-photosensitive insulating material may easily be planarized, an undulation issue or cracks caused by protruding electrodes of the first and second electronic components 120A and 120B may be resolved. Also, the film-type non-photosensitive insulating material may form an opening using a laser via, and thus, even when a material of the insulating material 130 is bled to the electrodes of the first and second electronic components 120A and 120B, the electrodes may be effectively opened using the laser via. Thus, the issues of opened electrode defects may be resolved. Also, as the wiring member 140 may be formed before the first and second semiconductor chips 161 and 162 are disposed or mounted, a yield of the first and second semiconductor chips 161 and 162 may not be affected.

In the package module 100A in the example embodiment, a photosensitive insulating material (PID) may be used for the insulating layer 181 of the interconnect structure 180, and in this case, a fine pitch may be included through a photo via. Accordingly, several tens or several hundreds of the first and second connection pads 161P and 162P of the first and second semiconductor chips 161 and 162 may be efficiently redistributed as in a general package module. Thus, a material of the insulating layer 181 on which the wiring layer 142 and the wiring via 143 are formed, and a material of the insulating layer 181 on which the redistribution layer 182 and the connection via 183 are formed may be selectively controlled.

In the package module 100A in the example embodiment, the wiring member 140 may be included in the core structure 150 before the first and second recessed portions 150HA and 150HB (in which the first and second semiconductor chips 161 and 162 are disposed) are formed. Accordingly, bottom surfaces of the first and second penetrating portions 110HA and 110HB may have opened surfaces and stepped portions of the first and second recessed portions 150HA and 150HB such that bottom surfaces of the first and second electronic components 120A may be coplanar with each other, and stepped portions may be formed between the bottom surfaces (of the first and second electronic components 120A) and the first and second active surfaces of the first and second semiconductor chips 161 and 162. The first and second active surfaces of the first and second semiconductor chips 161 and 162 may be positioned at a level lower than surfaces of the first and second electronic components 120A and 120B being in contact with the wiring member 140. Thus, the first and second connection members 161B and 162B may be disposed on the first and second connection pads 161P and 162P of the first and second semiconductor chips 161 and 162, respectively, a third connection member 142B may be disposed on the wiring layer 142, the connection members and the wiring layer 142 may be buried together using the encapsulant 170, and a grinding process may be performed. Accordingly, a planar surface for building the interconnect structure 180 may be provided. For example, surfaces of the first and second connection members 161B being in contact with the interconnect structure 180, a surface of the third connection member 142B being in contact with the interconnect structure 180, and a surface of the encapsulant 170 being in contact with the interconnect structure 180 may be coplanar with one another. The interconnect structure 180 may be formed on the coplanar surface, and thus, a fine design of the interconnect structure 180 may easily be implemented.

In the package module 100A in the example embodiment, the first and second electronic components 120A and 120B may be a capacitor and/or an inductor, and the first and second semiconductor chips 161 and 162 may be a power management integrated circuit (PMIC) and/or a radio frequency integrated circuit (RFIC). Thus, when an antenna package (not illustrated) is disposed on the package module 100A, manufactured based on the compact design as described above, in a form of package on package (POP), an appropriate form of an antenna module (not illustrated) may be implemented. Thus, an antenna module may be provided which may effectively prevent electromagnetic interference between different types of blocks even while a plurality of chips and components are included, may improve heat dissipation, may reduce a signal path between an antenna and a chip, may secure omnidirectional coverage properties, and may improve reception sensitivity.

In the description below, elements of the package module 100A will be described in greater detail with reference to the drawings.

As the frame 110 includes the plurality of conductor pattern layers 112a and 112b, the number of layers of redistribution layers 182 of the interconnect structure 180 may be reduced. Also, as the frame 110 includes the conductor via 113 electrically connecting the conductor pattern layers 112a and 112b, the frame 110 may work as an electrical connector member for upward and downward electrical connections. If desired, the frame 110 may improve stiffness of the package module 100A depending on a specific material of the insulating material 111, and may secure uniformity of a thickness of the insulating material. The frame 110 may have first and second penetrating portions 110HA and 110HB spaced apart from each other by a certain distance, and one or more first and second electronic components 120A and 120B may be disposed in the first and second penetrating portions 110HA and 110HB and may be spaced apart from side walls of the first and second penetrating portions 110HA and 110HB. The first and second penetrating portions 110HA and 110HB may penetrate through the frame 110, and side walls of the first and second penetrating portions 110HA and 110HB may be formed consecutively to surround the first and second electronic components 120A and 120B. However, an example embodiment thereof is not limited thereto, and forms of the frame 110 and the first and second penetrating portions 110HA and 110HB may vary. If desired, the frame 110 may only have the first penetrating portion 110HA or the second penetrating portion 110HB, and only the first electronic component 120A or the second electronic component 120B may be disposed.

The frame 110 may include an insulating layer 111, a first conductor pattern layer 112a disposed on a lower surface of the insulating layer 111, a second conductor pattern layers 112b disposed on an upper surface of the insulating layer 111, and a conductor via 113 penetrating the insulating layer 111 and connecting the first and second conductor pattern layers 112a and 112b. The first and second conductor pattern layers 112a and 112b of the frame 110 may have a thickness greater than a thickness of a redistribution layer 182 of the interconnect structure 180. The first and second conductor pattern layers 112a and 112b of the frame 110 may have an increased size through a substrate process in accordance with a scale of the first and second electronic components 120A and 120B. The redistribution layer 182 of the interconnect structure 180 may have a reduced size for a fine design and a high density design.

A material of the insulating layer 111 may not be limited to any particular material. For example, an insulating material may be used. The insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), such as prepreg, ajinomoto build-up film (ABF), FR-4, bismaleimide triazine (BT), or the like, for example. If desired, a photoimageable encapsulant (PIE) resin may also be used. For example, depending on desired properties of a material for the insulating layer 111, a general copper clad laminate (CCL) of low Df and low Dk, or glass or a ceramic insulating material of low Df and high Dk may be applied.

The first and second conductor pattern layers 112a and 112b may redistribute or interconnect the first and second connection pads 161P and 162P of the first and second semiconductor chips 161 and 162 and/or terminals of the first and second electronic components 120A and 120B, and may also provide an upper and lower electrical connection path of the package module 100A. As a material of the first and second conductor pattern layers 112a and 112b, a metal material such as copper (Cu), aluminum (Al), silver (Ag), tin (Sn), gold (Au), nickel (Ni), lead (Pb), titanium (Ti), or alloys thereof may be used. The first and second conductor pattern layers 112a and 112b may perform various functions depending on a design of respective layers. For example, the first and second conductor pattern layers 112a and 112b may include a ground (GrouND: GND) pattern, a power (PoWeR: PWR) pattern, a signal (Signal: S) pattern, and the like. The signal (S) pattern may include various signals other than aground (GND) pattern, a power (PWR) pattern, and the like, such as a data signal. The ground (GND) pattern and the power (PWR) pattern may have the same pattern. The first and second conductor pattern layers 112a and 112b may include various types of via pads, and the like.

The conductor via 113 may electrically connect the first and second conductor pattern layers 112a and 112b formed on different layers, and may accordingly form an electrical path in the frame 110. As a material of the conductor via 113, a metal material such as copper (Cu), aluminum (Al), silver (Ag), tin (Sn), gold (Au), nickel (Ni), lead (Pb), titanium (Ti), or alloys thereof may be used. The conductor via 113 may be a filled type completely filled with a metal material, or may be conformal type in which a metal material is formed along a side wall of a via hole. The conductor via 113 may have a sandglass shape, a cylindrical shape, or the like. The conductor via 113 may include a via for a signal, a via for a ground and/or power, and the like.

The first and second electronic components 120A and 120B may be disposed in the first and second penetrating portions 110HA and 110HB, respectively. The first and second electronic components 120A and 120B may be disposed substantially in parallel to (e.g., horizontally level with) the first and second semiconductor chips 161 and 162. The first and second electronic components 120A and 120B may be a general passive component such as a capacitor, an inductor, and the like. However, an example of the first and second electronic components 120A and 120B is not limited thereto, and if desired, the first and second electronic components 120A and 120B may include an integrated circuit die. The first and second electronic components 120A and 120B may be electrically connected to the first and second connection pads 161P and 162P of the first and second semiconductor chips 161 and 162 through the redistribution layer 182 of the interconnect structure 180. The numbers of the first and second electronic components 120A and 120B are not limited to any particular number.

The insulating material 130 may protect the frame 110 and the first and second electronic components 120A and 120B, and may provide an insulating region. An example of an encapsulating form is not limited to any particular form, and the insulating material 130 may cover at least a portion of each of the frame 110 and the first and second electronic components 120A and 120B, and may fill at least a portion of each of the first and second penetrating portions 110HA and 110HB. The insulating material 130 may be disposed between the first and second electronic components 120A and 120B and side walls of the respective first and second penetrating portions 110HA and 110HB. A material of the insulating material 130 is not limited to any particular material. For example, an ABF or a photo imageable encapsulant (PIE) may be used, but a material of the insulating material 130 is not limited thereto.

The wiring member 140 may include one or more insulating layer(s) 141 disposed in portions of the frame 110 and the first and second electronic components 120A and 120B opposing the interconnect structure 180, one or more wiring layer(s) 142 disposed on the insulating layer 141, and one or more wiring via(s) 143 penetrating the insulating layer 141 and electrically connecting the wiring layer 142 and the first and second electronic components 120A and 120B. The wiring member 140 may include a greater number of the insulating layer 141, the wiring layer 142, and the wiring via 143 than the example illustrated in the diagram. The wiring member 140 may be omitted if desired, but the core structure 150 may include the wiring member 140 as described above.

An insulating material may be used as a material of the insulating layer 141, and the insulating material may be a non-photosensitive insulating material such as an ABF as described above. Thus, the insulating layer 141 may be a non-photosensitive insulating layer. When a plurality of the insulating layers 141 are provided, a boundary between the insulating layers may be indistinct as the insulating layers may be integrated with each other through a process.

The wiring layer 142 may primarily redistribute the first and second electronic components 120A and 120B, and a material of the wiring layer 142 may be a metal material such as copper (Cu), aluminum (Al), silver (Ag), tin (Sn), gold (Au), nickel (Ni), lead (Pb), titanium (Ti), or alloys thereof. The wiring layer 142 may perform various functions depending on designs of respective layers. For example, the wiring layer 142 may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The ground (GND) pattern and the power (PWR) pattern may have the same pattern. The first and second conductor pattern layers 112a and 112b may include various types of via pads, and the like.

The wiring via 143 may electrically connect the wiring layer 142, the first and second electronic components 120A and 120B, the first conductor pattern layer 112a, and the like, to each other, formed on different layers, and may accordingly form an electrical path in the core structure 150. As a material of the wiring via 143, a metal material such as copper (Cu), aluminum (Al), silver (Ag), tin (Sn), gold (Au), nickel (Ni), lead (Pb), titanium (Ti), or alloys thereof may be used. The wiring via 143 may be a filled type completely filled with a metal material, or may be conformal type in which a metal material is formed along a side wall of a via hole. The wiring via 143 may have a tapered shape. The wiring via 143 may include a via for a signal, a via for a ground and/or power, and the like.

The first metal layer 115 may be disposed on aside wall of each of the first and second penetrating portions 110HA and 110HB and may extend to one surface of the frame 110, such as upper and lower surfaces of the frame 110, for example. The first metal layer 115 may cover overall side walls of the first and second penetrating portions 110HA and 110HB, and may accordingly surround side surfaces of the first and second electronic components 120A and 120B such that the first metal layer 115 may effectively shield electromagnetic waves and may improve a heat dissipation effect. The first metal layer 115 may include a metal material such as copper (Cu), aluminum (Al), silver (Ag), tin (Sn), gold (Au), nickel (Ni), lead (Pb), titanium (Ti), or alloys thereof. The first metal layer 115 may be electrically connected to a ground pattern of the first conductor pattern layer 112a and/or the second conductor pattern layer 112b, and a ground pattern of the wiring layer 142 and/or the redistribution layer 182, and may be used as a ground surface. The first metal layer 115 may be omitted, but may be included to effectively shield electromagnetic waves and to improve heat dissipation while implementing a compact design as described above.

The second metal layer 155 may be disposed on side walls of the first and second recessed portions 150HA and 150HB and may extend to one surface of the core structure 150, to a lower surface of the core structure 150, for example. The second metal layer 155 may cover overall side walls of the first and second recessed portions 150HA and 150HB, and may accordingly surround side surfaces of the first and second semiconductor chips 161 and 162, thereby effectively shielding electromagnetic waves and improving heat dissipation effect. The second metal layer 155 may extend to bottom surfaces of the first and second recessed portions 150HA and 150HB, and may cover at least a portion of each of the first and second stopper layers 152A and 152B. As the second metal layer 155 is connected to the first and second stopper layers 152A and 152B, a shielding effect may be effectively implemented, and a heat dissipation effect may improve. The second metal layer 155 may include a metal material such as copper (Cu), aluminum (Al), silver (Ag), tin (Sn), gold (Au), nickel (Ni), lead (Pb), titanium (Ti), or alloys thereof. The second metal layer 155 may be electrically connected to a ground pattern of the first conductor pattern layer 112a and/or the second conductor pattern layer 112b, and a ground pattern of the wiring layer 1442 and/or the redistribution layer 182, and may be used as a ground surface. The second metal layer 155 may be omitted, but may be included to effectively shield electromagnetic waves and to improve heat dissipation while implementing a compact design as described above.

The backside metal layer 132A may effectively block electromagnetic waves flowing into the backsides of the first and second semiconductor chips 161 and 162 and the first and second electronic components 120A and 120B, and may accordingly isolate different types of blocks from each other effectively. The backside metal layer 132A may also improve heat dissipation in the backsides of the first and second semiconductor chips 161 and 162 and the first and second electronic components 120A and 120B. To this end, the backside metal layer 132A may be disposed in a plate form to cover the first and second inactive surfaces of the first and second semiconductor chips 161 and 162 and direct upper regions of (or overlapping) the first and second electronic components 120A and 120B. Thus, the backside metal layer 132A may have a plate shape, and if desired, the backside metal layer 132A may be implemented as a plurality of plates. As a material of the backside metal layer 132A, a metal material such as copper (Cu), aluminum (Al), silver (Ag), tin (Sn), gold (Au), nickel (Ni), lead (Pb), titanium (Ti), or alloys thereof may be used. The backside metal layer 132A may also be electrically connected to a ground pattern of the first conductor pattern layer 112a and/or the second conductor pattern layer 112b, and a ground pattern of the wiring layer 1442 and/or the redistribution layer 182, and may be used as a ground surface. The backside metal layer 132A may be omitted, but may be included to effectively shield electromagnetic waves and to improve heat dissipation while implementing a compact design as described above.

The first and second backside metal vias 133Aa and 133Ab may connect the backside metal layer 132A to the first metal layer 115 and the first and second stopper layers 152A and 152B such that the first and second backside metal vias 133Aa and 133Ab may effectively block electromagnetic waves in the backsides of the first and second semiconductor chips 161 and 162 and the first and second electronic components 120A and 120B, and may accordingly isolate different types of blocks effectively. A plurality of the second metal vias 133Ab may be disposed on direct upper regions of (or overlapping) the first and second inactive surfaces of the first and second semiconductor chips 161 and 162 such that a heat dissipation effect in the backside of the first and second semiconductor chips 161 and 162 may improve. As a material of the first and second backside metal vias 133Aa and 133Ab, a metal material such as copper (Cu), aluminum (Al), silver (Ag), tin (Sn), gold (Au), nickel (Ni), lead (Pb), titanium (Ti), or alloys thereof may be used. The first and second backside metal vias 133Aa and 133Ab each may be a filled type completely filled with a metal material, or may be conformal type in which a metal material is formed along a side wall of a via hole. The first and second backside metal vias 133Aa and 133Ab may have a tapered shape, tapered in an opposite direction to the tapered direction of the wiring via 143. The first and second backside metal vias 133Aa and 133Ab may also be electrically connected to a ground pattern of the first conductor pattern layer 112a and/or the second conductor pattern layer 112b, and a ground pattern of the wiring layer 1442 and/or the redistribution layer 182, and may be used as a ground surface. The first and second backside metal vias 133Aa and 133Ab may be omitted, but may be included to effectively shield electromagnetic waves and to improve heat dissipation while implementing a compact design as described above.

The backside conductor pattern layer 132B may be electrically connected to the first and second conductor pattern layers 112a and 112b of the frame 110, and may provide pads for the elements for a signal among electrical connector metals. Thus, when the package module 100A is mounted on a mainboard, and the like, the backside conductor pattern layer 132B may provide a connection path for a signal. The backside conductor pattern layer 132B may redistribute the first and second connection pads 161P and 162P of the first and second semiconductor chips 161 and 162 and the first and second electronic components 120A and 120B. As a material of the backside conductor pattern layer 132B, a metal material such as copper (Cu), aluminum (Al), silver (Ag), tin (Sn), gold (Au), nickel (Ni), lead (Pb), titanium (Ti), or alloys thereof may be used. The backside conductor pattern layer 132B may perform various functions depending on a design. For example, the backside conductor pattern layer 132B may include a signal pattern. The backside conductor pattern layer 132B may also include a via pad, an electrical connector metal pad, and the like. The backside conductor pattern layer 132B may alternatively be omitted, but may be included to implement a compact design and to form electrical connections with other elements of the package module 100A.

The backside conductor via 133B may electrically connect the backside conductor pattern layer 132B, the second conductor pattern layer 112b, and the like, formed on different layers. As a material of the backside conductor via 133B, a metal material such as copper (Cu), aluminum (Al), silver (Ag), tin (Sn), gold (Au), nickel (Ni), lead (Pb), titanium (Ti), or alloys thereof may be used. The backside conductor via 133B may be a filled type completely filled with a metal material, or may be conformal type in which a metal material is formed along a side wall of a via hole. The backside conductor via 133B may have a tapered shape, tapered in an opposite direction to the tapered direction of the wiring via 143. The backside conductor via 133B may also be used as a via for signal connection. The backside conductor via 133B may alternatively be omitted, but may be included to implement a compact design and to form electrical connections with other elements of the package module 100A.

The first semiconductor chip 161 may be an integrated circuit (IC) in a bare state in which several hundred to several millions or more of devices are integrated in a single chip, and if desired, the first semiconductor chip 161 may also be a packaged integrated circuit (IC). The integrated circuit (IC) may be a power management integrated circuit (PMIC), for example. The first semiconductor chip 161 may include a body in which various circuits are disposed, and the first connection pad 161P may be disposed on an active surface of the body. The body may be formed based on an active wafer, for example, and in this case, silicon (Si), germanium (Ge), gallium arsenide (GaAs), and the like, may be used as abase material. The first connection pad 161P may electrically connect the first semiconductor chip 161 to other elements, and a material of the first connection pad 161P may preferably be a metal material, such as copper (Cu) or aluminum (Al), but a material of the first connection pad 161P is not limited thereto. The first semiconductor chip 161 may include a first active surface on which the first connection pad 161P is disposed, and a first inactive surface opposing the first active surface. A passivation film (not illustrated) including an oxide film and/or a nitride film having a groove or opening(s) exposing at least a portion of the first connection pad(s) 161P may be formed on the first active surface of the first semiconductor chip 161. In this case, the positional relationship with other elements on the first active surface may be determined with reference to the passivation film (not illustrated). The first semiconductor chip 161 may be disposed on the first recessed portion 150HA such that the first inactive surface may be attached to the first stopper layer 152A using the first adhesive member 165A such as a die attach film (DAF) as a medium. The first recessed portion 150HA may have a blind form, and a side wall of the first recessed portion 150HA may surround the first semiconductor chip 161, and the side wall may have a certain slope (e.g., the side wall may not be orthogonal to a bottom surface of the first recessed portion 150HA). When the side wall has a certain slope, the first semiconductor chip 161 may easily be disposed.

The second semiconductor chip 162 may also be an integrated circuit (IC) in a bare state, and if desired, the second semiconductor chip 162 may be a packaged integrated circuit (IC). The integrated circuit (IC) may be a radio frequency integrated circuit (RFIC), for example. Thus, the package module 100A in the example embodiment may be a complex module which includes both of an RFIC and a PMIC, but an example embodiment thereof is not limited thereto. Only one of the first and second recessed portions 150HA and 150HB may be formed in the core structure 150, and only one of the first and second recessed portions 150HA and 150HB may be included. The second semiconductor chip 162 may also include the second connection pad 162P formed on a body, and if desired, the second semiconductor chip 162 may further include a passivation film (not illustrated), and the like. The second semiconductor chip 162 may include a second active surface on which the second connection pad 162P is disposed, and a second inactive surface opposing the second active surface. When the passivation film (not illustrated) is formed, the positional relationship with other elements on the second active surface may be determined with reference to the passivation film (not illustrated). The second semiconductor chip 162 may be disposed on the second recessed portion 150HB such that the second inactive surface may be attached to the second stopper layer 152B using the second adhesive member 165B such as a die attach film (DAF) as a medium. The second recessed portion 150HB may have a blind form, and a side wall of the second recessed portion 150HB may surround the second semiconductor chip 162, and the side wall may have a certain slope (e.g., the side wall may not be orthogonal to a bottom surface of the second recessed portion 150HB). When the side wall has a certain slope, the second semiconductor chip 162 may easily be disposed.

The first and second connection members 161B and 162B may be included to connect the first and second connection pads 161P and 162P of the first and second semiconductor chips 161 and 162 to the redistribution layer 182 of the interconnect structure 180. The first and second connection members 161B and 162B may each be a metal post or a metal pillar, such as a copper post or a copper pillar, but an example embodiment thereof is not limited thereto. As the first and second connection members 161B and 162B are included, the first and second connection pads 161P and 162P of the first and second semiconductor chips 161 and 162 may easily be connected to the redistribution layer 182 of the interconnect structure 180 regardless of thicknesses of the first and second semiconductor chips 161 and 162. The first and second connection members 161B and 162B may have approximately vertical side surfaces. The numbers of the first and second connection members 161B and 162B may not be limited to any particular number, and may vary depending on the number of the first and second connection pads 161P and 162P. The first and second connection members 161B and 162B may be electrically connected to the redistribution layer 182 through first and second connection vias among the connection vias 183 of the interconnect structure 180, and may be physically in contact with the first and second connection vias of the connection vias 183. If desired, the first and second connection members 161B and 162B may be omitted, and the first and second connection pads 161P and 162P may be directly connected to the first and second connection vias of the connection vias 183, but the first and second connection members 161B and 162B may be included to control a thickness.

The third connection member 142B may be included to electrically connect the wiring layer 142 of the wiring member 140 to the redistribution layer 182 of the interconnect structure 180. When the third connection member 142B is not included, a surface of the wiring layer 142 may be processed during a grinding process, and in this case, a surface area may be wide such that a copper burr may occur. When the third connection member 142B is included, a surface of the third connection member 142B having a relatively small surface area may be ground instead of the wiring layer 142, and accordingly, the copper burr issue may be resolved. The third connection member 142B may have a pillar portion in which a via portion and a side surface are vertical. The number of the third connection member 142B is not limited to any particular number, and may vary depending on a design of a pattern of the wiring layer 142. The third connection member 142B may be electrically connected to the redistribution layer 182 through a third connection via among the connection vias 183 of the interconnect structure 180, and may be physically in contact with the third connection via. If desired, a plurality of the wiring layers 142 and the wiring vias 143 may be provided, instead of the third connection member 142B. In this case, the wiring layer 142 and the wiring via 143 disposed in a lowermost portion in the example illustrated in the diagram may work as the third connection member 142B. The third connection member 142B may be included in the wiring layer 142 and the wiring via 143 as a sub-element of the wiring member 140. If desired, an additional connection member (not illustrated) such as a copper post or a copper pillar may be disposed on the third connection member 142B, and in this case, the additionally disposed connection member (not illustrated) may be physically in contact with the third connection via among the connection vias 183 of the interconnect structure 180.

The encapsulant 170 may protect the core structure 150 and the first and second semiconductor chips 161 and 162 and may provide an insulating region. An encapsulating form is not limited to any particular form, and the encapsulant 170 may cover at least a portion of each of the core structure 150 and the first and second semiconductor chips 161 and 162, and may fill at least a portion of each of the first and second penetrating portions 110HA and 110HB. The encapsulant 170 may also cover side surfaces of the first and second connection members 161B and 162B and the third connection member 142B. When another connection member (not illustrated) is disposed on the third connection member 142B, the encapsulant 170 may also cover a side surface of the other connection member. A specific material of the encapsulant 170 is not limited to any particular material. For example, an ABF or a PIE may be used, but an example of a material of the encapsulant 170 is not limited thereto.

The encapsulant 170 may bury the first and second connection members 161B and 162B and the third connection member 142B such that surfaces of the first and second connection members 161B and 162B and the third connection member 142B being in contact with the interconnect structure 180 may be exposed from a surface of the encapsulant 170 being in contact with the interconnect structure 180. The surfaces of the first and second connection members 161B and 162B and the third connection member 142B being in contact with the interconnect structure 180 may be coplanar with the surface of the encapsulant 170 being in contact with the interconnect structure 180. That is because the first and second connection members 161B and 162B, the second connection member 142B, and the encapsulant 170 may be ground simultaneously. In this case, a planar surface may be provided for a process of manufacturing the interconnect structure 180, and a fine design of the interconnect structure 180 may easily be implemented. When another connection member (not illustrated) is further disposed on the second connection member 142B, a surface of the connection member (not illustrated) being in contact with the interconnect structure 180 may be coplanar with the surfaces of the first and second connection members 161B and 162B and the encapsulant 170 being in contact with the interconnect structure 180.

The interconnect structure 180 may redistribute the first and second connection pads 161P and 162P of the first and second semiconductor chips 161 and 162, and may electrically connect the first and second connection pads 161P and 162P of the first and second semiconductor chips 161 and 162 to the first and second electronic components 120A and 120B. Through the interconnect structure 180, the several tens to several millions of first and second connection pads 161P and 162P of the first and second semiconductor chips 161 and 162 having various functions may be redistributed. The interconnect structure 180 may include an insulating layer 181 disposed on the coplanar surface described above, the redistribution layer 182 disposed on the insulating layer 181, and the connection via 183 penetrating the insulating layer 181 and connected to the redistribution layer 182. The number of the interconnect structures 180 may be configured to be greater or less than the example illustrated in the diagram. For example, multiple interconnect structures 180 may be stacked on each other with respective redistribution layers 182 thereof interconnected by connection vias 183 penetrating therethrough.

An insulating material may be used as a material of the insulating layer 181, and the insulating material may be a photosensitive insulating material such as a PID resin other than the above-described insulating material. The insulating layer 181 may be a photosensitive insulating layer. When the insulating layer 181 is photosensitive, a thickness of the insulating layer 181 may be further reduced, and accordingly, a fine pitch of the connection via 183 may easily be achieved. The insulating layer 181 may be a photosensitive insulating layer including an insulating resin and an inorganic filler. When a plurality of the insulating layers 181 are provided, materials of the insulating layers may be the same, or may be different if desired. When a plurality of the insulating layers 181 are provided, the insulating layers may be integrated with each other such that boundaries between the insulating layers may be indistinct.

The redistribution layer 182 may redistribute the first and second connection pads 161P and 162P of the first and second semiconductor chips 161 and 162 and electrodes of the first and second electronic components 120A and 120B, and as a material of the redistribution layer 182, a metal material such as copper (Cu), aluminum (Al), silver (Ag), tin (Sn), gold (Au), nickel (Ni), lead (Pb), titanium (Ti), or alloys thereof may be used. The redistribution layer 182 may perform various functions depending on a design of a respective layer. For example, the redistribution layer 182 may include a ground (GrouND: GND) pattern, a power (PoWeR: PWR) pattern, a signal (Signal: S) pattern, and the like. The signal (S) pattern may include various signals other than aground (GND) pattern, a power (PWR) pattern, and the like, such as a data signal. The ground (GND) pattern and the power (PWR) pattern may have the same pattern. The redistribution layer 182 may include various types of via pads, connection terminal pads, and the like.

The connection via(s) 183 may electrically connect the redistribution layer(s) 182, the first and second connection members 161B and 162B, the third connection member(s) 142B, and the like, formed on different layers, and may accordingly form an electrical path in the package module 100A. As a material of the connection via 183, a metal material such as copper (Cu), aluminum (Al), silver (Ag), tin (Sn), gold (Au), nickel (Ni), lead (Pb), titanium (Ti), or alloys thereof may be used. The connection via 153 may be a filled type completely filled with a metal material, or may be conformal type in which a metal material is formed along a side wall of a via hole. The connection via 183 may have a tapered shape, tapered in an opposite direction to the tapered direction of the backside conductor via 133B. The connection via 183 may include a via for a signal, a via for a ground and/or power, and the like.

A first passivation layer 191 may be an additional element, and may protect the redistribution layer 182 of the interconnect structure 180 against external physical and chemical damages, or the like. The first passivation layer 191 may include an insulating resin and an inorganic filler, and may not include a glass fiber. For example, the first passivation layer 191 may be an ABF, but a material of the first passivation layer 191 is not limited thereto, and a material of the passivation layer 191 may be a PID, a solder resist (SR), or the like. The passivation layer 191 may include a plurality of openings exposing at least a portion of the redistribution layer 182 of the interconnect structure 180.

A second passivation layer 192 may also be an additional element, and may protect the backside metal layer 132A and the backside conductor pattern layer 132B from external physical and chemical damages, or the like. A plurality of the second passivation layers 192 may be provided. Each of the layers 192a and 192b may include an insulating resin and an inorganic filler, and may not include a glass fiber, and may be, for example, an ABF, but a material of the layers is not limited thereto. If desired, the first layer 192a may be pregreg, and the second layer 192B may be an ABF. A surface processing layer P may be formed on a surface of each of the backside metal layer 132A and the backside conductor pattern layer 132B exposed by an opening 192h. The surface processing layer P may be a nickel (Ni)/gold (Au) plated layer, but an example of the surface processing layer P is not limited thereto. Although not illustrated, a plurality of electrical connector metals (not illustrated) electrically connected to the exposed backside metal layer 132A and the exposed backside conductor pattern layer 132B may be disposed on a plurality of openings 192h.

An under bump metal 193 may also be an additional element, and may be disposed in each of a plurality of openings of the first passivation layer 191, and may be electrically connected to the redistribution layer 182. The under bump metal 193 may include a metal material such as copper (Cu), aluminum (Al), silver (Ag), tin (Sn), gold (Au), nickel (Ni), lead (Pb), titanium (Ti), or alloys thereof. The under bump metal 193 may be connected to the electrical connector metal 194 and may improve reliability of the electrical connector metal 194.

The electrical connector metal 194 may physically and/or electrically connect the package module 100A to an external entity. For example, the package module 100A may be connected to an antenna substrate (not illustrated) through the electrical connector metal 194. In this case, the electrical connector metal may be used to mount the package module on a mainboard (not illustrated) of an electronic device, and the like. The package module 100A may be mounted on a mainboard of the electronic device through the electrical connector metal 194. The electrical connector metal 194 may be formed of a metal having a low melting point, a material including tin (Sn), such as a solder, for example. However, a material of the electrical connector metal 194 is not limited thereto. The electrical connector metal 194 may be a land, a ball, a pin, and the like. The electrical connector metal 194 may be implemented as a plurality of layers, or may be implemented as a single layer. When the electrical connector metal 194 is implemented as a plurality of layers, the electrical connector metal 194 may include a copper pillar and a solder, and when the electrical connector metal 194 is implemented as a single layer, the electrical connector metal 194 may also include a solder or copper, but an example embodiment thereof isnot limited thereto. The number of the electrical connector metals 194, a gap between the electrical connector metals 194, an arrangement form of the electrical connector metals 194 are not limited to any particular example, and may vary.

At least one of the electrical connector metals 194 may be disposed in a fan-out region. The fan-out region may refer to a region beyond (or outside of) a region in which the first and second semiconductor chips 161 and 162 are disposed (e.g., a region outside of a region of overlap with the first and second semiconductor chips 161 and 162 along a stacking direction of the first and second semiconductor chips 161 and 162 on the interconnect structure 180). A fan-out package may have more improved reliability as compared to a fan-in package, may implement a plurality of I/O terminals, and may easily perform a 3D interconnection. Also, a fan-out package may have a reduced thickness as compared to an land grid array package (LGA), and the like, and may be cost-competitive. Thus, the package module 100A may be a fan-out package module 100A.

FIGS. 11 to 16 are diagrams illustrating sequential steps of processes for manufacturing a package module such as that illustrated in FIG. 9.

Figure 11:
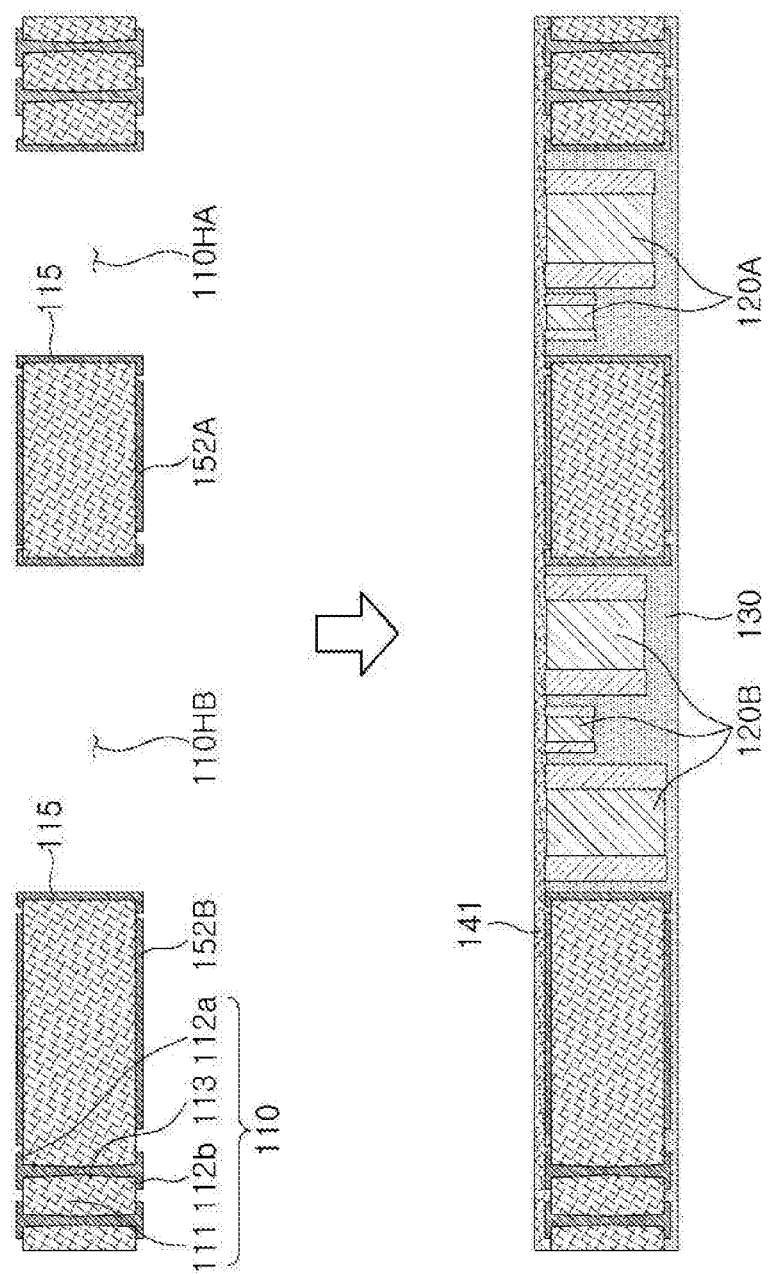
FIGS. 11 to 16 are diagrams illustrating processes of manufacturing a package module illustrated in FIG. 9.

Referring to FIG. 11, a frame 110 may be prepared. For example, an insulating layer 111 may be prepared using a copper clad laminate (CCL), first and second stopper layers 152A and 152B, first and second conductor pattern layers 112a and 112b, one or more conductor via(s) 113 may be formed using a plating process such as an additive process (AP), a semi-AP (SAP), a modified SAP (MSAP), a tenting process, and the like, first and second penetrating portions 110HA and 110HB may be formed penetrating through the insulating layer 111 using a laser drill, and a first metal layer 115 may be formed using the above-described process, thereby preparing the frame 110. First and second electronic components 120A and 120B may be disposed in the first and second penetrating portions 110HA and 110HB, respectively, using a tape, and the like, and the frame 110 and the first and second electronic components 120A and 120B may be capsulated using an insulating material 130 such as an ABF, and the like. An insulating layer 141 may be formed in a region in which the tape is removed by layering an ABF, and the like.

Figure 12:
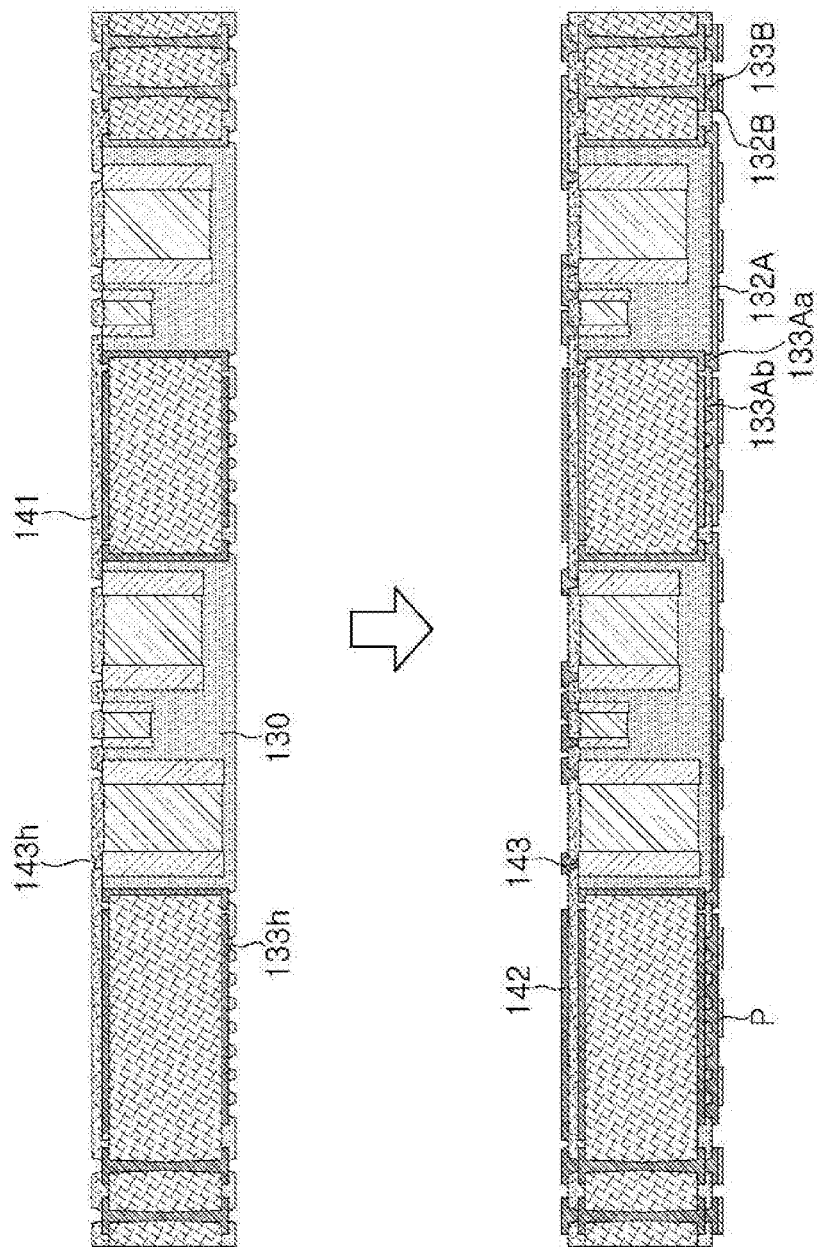

Referring to FIG. 12, a via hole 143h may be formed on or through the insulating layer 141 using a laser drill, and the like, and a via hole 133h may be formed on or through the insulating material 130 using a laser drill, and the like. A wiring layer 142 and a wiring via 143 may be formed on the insulating layer 141 and in the via hole(s) 143h, respectively, using the above-described plating processes. A backside metal layer 132A, a backside conductor pattern layer 132B, backside metal vias 133Aa and 133Ab, and a backside conductor via 133B may be formed on the insulating material 130 and in the via hole(s) 133h. A surface processing layer P may be formed by plating nickel (Ni)/gold (Au).

Figure 13:
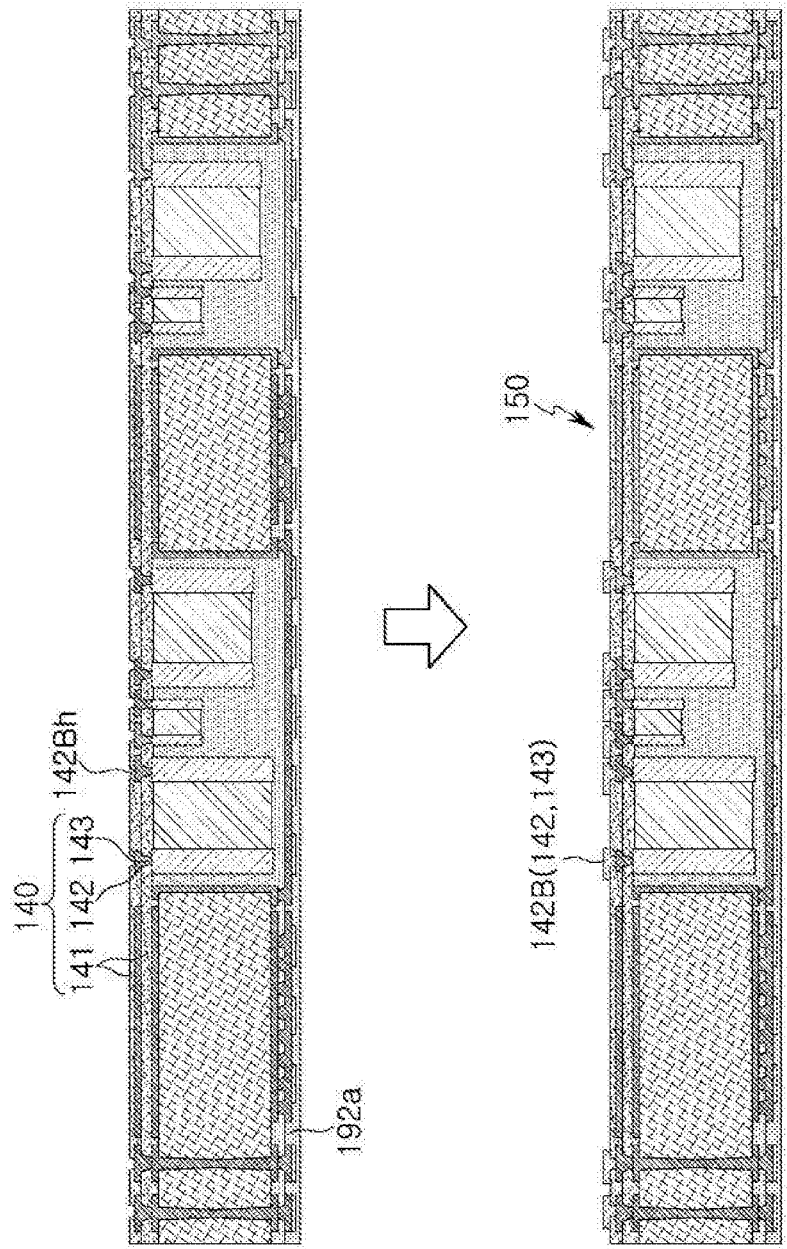

Referring to FIG. 13, the insulating layer 141 may be additionally formed by layering an ABF, and the like, and the wiring member 140 may accordingly be formed. A first layer 192a of a second passivation layer 192 may be formed on the opposite side by layering an ABF, and the like. A via hole 142Bh may be formed in the insulating layer 141 using a laser drill, and the like. A third connection member 142B may be formed using the above-described plating process. The third connection member 142B may be replaced with the wiring layer 142 and the wiring via 143 additionally formed as described above. The third connection member 142B may be a portion of the wiring layer 142 and the wiring via 143. Through the processes described above, a core structure 150 may be manufactured.

Figure 14:
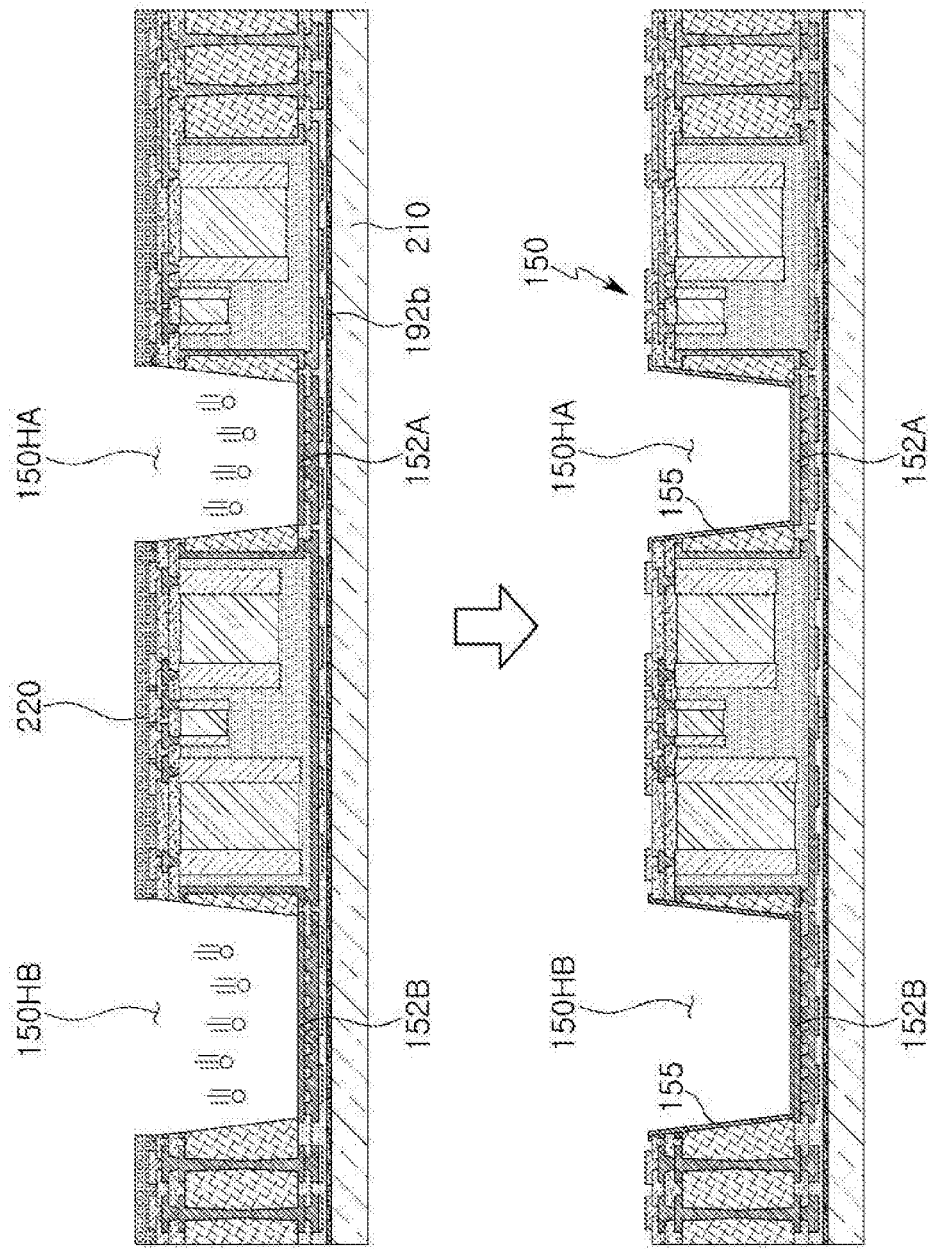

Referring to FIG. 14, a core structure 150 may be disposed on a carrier 210 on one surface of which an insulating layer 192b is formed. The insulating layer 192b may be used as a second layer 192b of a second passivation layer 192. While a portion of the opposite side of the core structure 150 is blocked, first and second recessed portions 150HA and 150HB each having a blind form may be formed using a dry film 220 through a sand blast process, and the like. In this process, first and second stopper layers 152A and 152B may be used as stoppers. The dry film 220 may be removed, and a second metal layer 155 may be formed on each of side walls of the first and second recessed portions 150HA and 150HB using the above-described plating processes. The second metal layer 155 may be formed to extend to one surface of the core structure 150, and may extend to bottom surfaces of the first and second recessed portions 150HA and 150HB to cover (and/or contact) at least a portion of each of the first and second stopper layers 152A and 152B.

Figure 15:
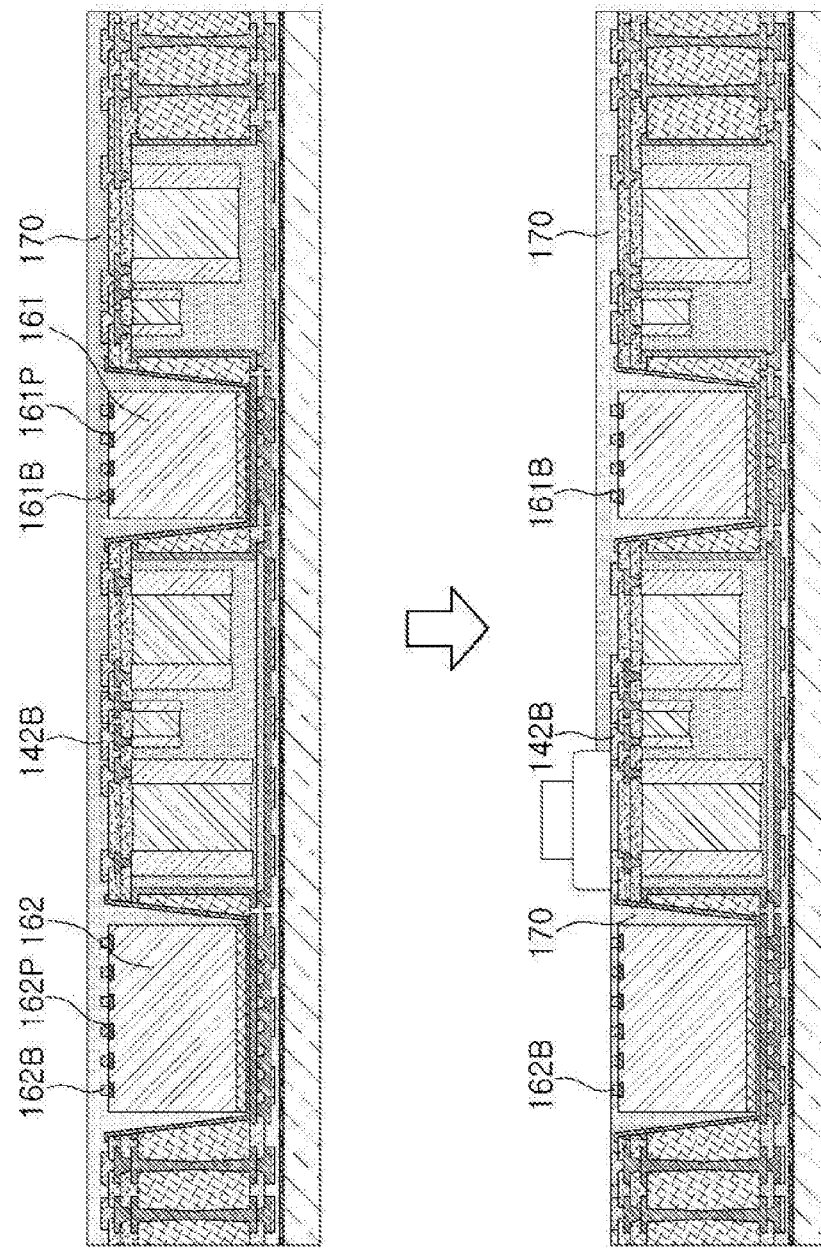

Referring to FIG. 15, first and second semiconductor chips 161 and 162 may be disposed in first and second recessed portions 150HA and 150HB using first and second adhesive members 165A and 165B, and first and second connection members 161B and 162B may be formed on first and second connection pads 161P and 162P. A core structure 150, the first and second semiconductor chips 161 and 162, and the first and second connection members 161B and 162B may be capsulated using an encapsulant 170. If desired, to resolve the issue of copper burr or a difference in thickness between elements, a connection member (not illustrated), a copper post or a copper pillar, may further be disposed on a third connection member 142B. One surfaces of the first and second connection members 161B and 162B, the third connection member 142B, and the encapsulant 170 may be processed to be coplanar with one another. For example, a surface of the encapsulant may be processed to expose the first and second connection members 161B and 162B, and the third connection member 142B therethrough, using a process such as a grinding process.

Figure 16:
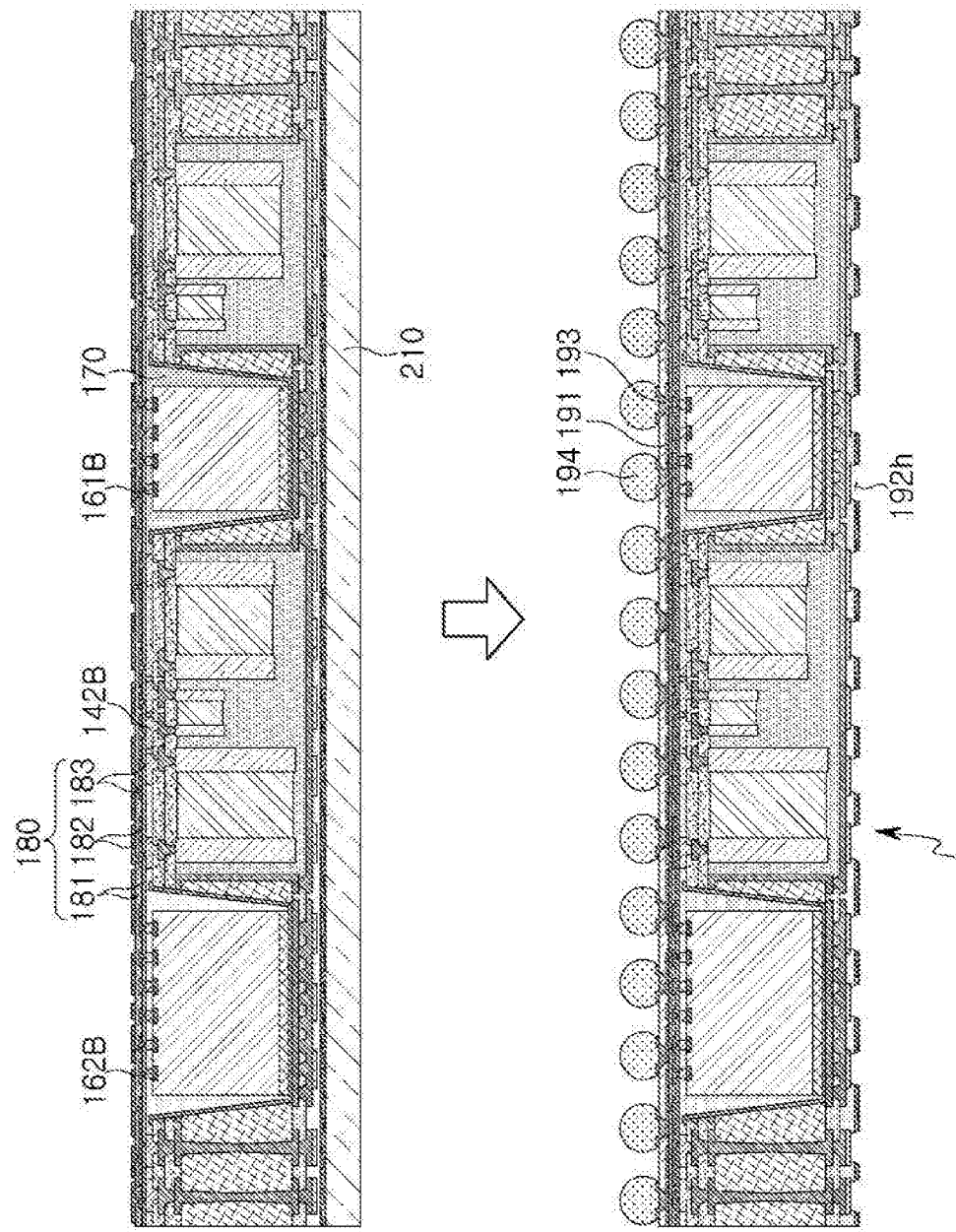

Referring to FIG. 16, an interconnect structure 180 may be formed on the coplanar surfaces of the first and second connection members 161B and 162B, the third connection member 142B, and the encapsulant 170. The interconnect structure 180 may be manufactured by repeating processes of forming an insulating layer 181 through a PID coating process and curing the insulating layer, forming a photo-via in the insulating layer 181, and forming a redistribution layer 182 and a connection via 183 on and in the insulating layer 181 through the above-described plating processes. A first passivation layer 191 may be formed on the interconnect structure 180 by layering an ABF, and the like, a plurality of openings may be formed through the first passivation layer 191, a plurality of under bump metals 193 may be formed using the above-described process in the openings, a plurality of electrical connector metals 194 connected to the plurality of under bump metals 193 may be formed, the carrier 210 may be removed, and the opening 192h, and the like, may be formed, thereby manufacturing the package module 100A.

The descriptions of the other elements may be substantially the same as the descriptions described with reference to FIGS. 9 and 10, and thus, the detailed descriptions thereof will not be provided.

Figure 17:
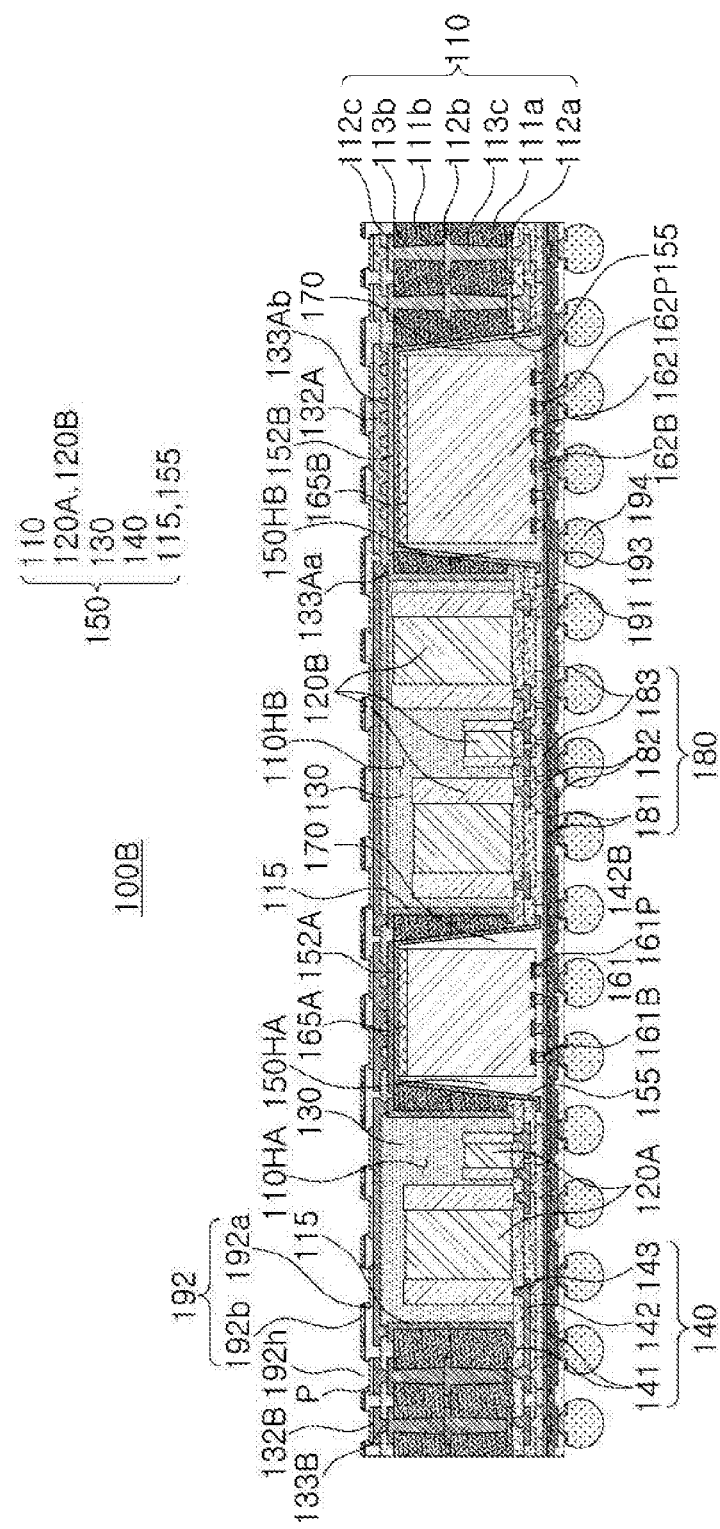
FIG. 17 is a schematic cross-sectional diagram illustrating another example of a package module.

FIG. 17 is a schematic cross-sectional diagram illustrating another example of a package module.

Referring to the diagram, in a package module 100B in the example embodiment, a frame 110 of a core structure 150 may include a first insulating layer 111a, a first conductor pattern layer 112a buried in the first insulating layer 111a such that one surface of the first conductor pattern layer 112a is exposed, a second conductor pattern layer 112b disposed in a portion (or surface) of the first insulating layer 111a opposing a portion (or surface) in which the first conductor pattern layer 112a is buried, a second insulating layer 111b disposed in the portion (or surface) of the first insulating layer 111a opposing the portion (or surface) in which the first conductor pattern layer 112a is buried, and covering the second conductor pattern layer 112b, and a third conductor pattern layer 112c disposed in a portion (or surface) of the second insulating layer 111b opposing a portion (or surface) in contact with the first insulating layer 111a. The first to third conductor pattern layers 112a, 112b, and 112c may be electrically connected to first and second connection pads 161P and 162P and first and second electronic components 120A and 120B. The first and second conductor pattern layers 112a and 112b and the second and third conductor pattern layers 112b and 112c may be electrically connected through first and second conductor vias 113a and 113b penetrating the first and second insulating layers 111a and 111b, respectively. Thus, when the frame 110 includes a greater number of conductor pattern layers 112a, 112b, and 112c, a design of the interconnect structure 180 may further be simplified, and an yield issue of the first and second semiconductor chips 161 and 162 occurring in the process of manufacturing the interconnect structure 180 may be resolved.

When the first conductor pattern layer 112a is buried in the first insulating layer 111a, a stepped portion formed due to a thickness of the first conductor pattern layer 112a may be significantly reduced, and thus, an insulating distance of the interconnect structure 180 may be constant. Thus, a difference between a distance from the redistribution layer 182 to the first insulating layer 111a, and a distance from the redistribution layer 182 of the interconnect structure 180 to one surface of each of the first and second connection pads 161P and 162P may be less than a thickness of the first conductor pattern layer 112a. Thus, a high density wiring design of the interconnect structure 180 may be implemented.

The first conductor pattern layer 112a may be recessed into the first insulating layer 111a. Thus, when the first conductor pattern layer 112a is recessed into the first insulating layer 111a, and a stepped portion is formed between one surface of the first insulating layer 111a and one surface of the first conductor pattern layer 112a, contamination of the first conductor pattern layer 112a caused by bleeding of a material of an encapsulant 170 may be prevented. The second conductor pattern layer 112b of the frame 110 may be positioned between an active surface and an inactive surface of each of first and second semiconductor chips 161 and 162. The frame 110 may have a significantly large thickness, and the second conductor pattern layer 112b formed in the frame 110 may be disposed on a level between an active surface and an inactive surface of each of first and second semiconductor chips 161 and 162.

A thickness of each of the first to third conductor pattern layers 112a, 112b, and 112c may be greater than a thickness of each of the redistribution layers 182. As the frame 110 has a significantly large thickness, the first to third conductor pattern layers 112a, 112b, and 112c may also have increased sizes in accordance with the thickness of the frame 110. The redistribution layers 182 may have a relatively smaller size than sizes of the first to third conductor pattern layers 112a, 112b, and 112c to implement a fine circuit design.

A material of the first and second insulating layers 111a and 111b may not be limited to any particular material. For example, an insulating material may be used, and a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, such as prepreg, ajinomoto build-up film (ABF), FR-4, bismaleimide triazine (BT), or the like, may be used, for example.

The first to third conductor pattern layers 112a, 112b, and 112c may redistribute the first and second connection pads 161P and 162P of the first and second semiconductor chips 161 and 162 and electrodes of the first and second electronic components 120A and 120B, and may control the frame 110 to perform as an electrical connection member. As a material of the first to third conductor pattern layers 112a, 112b, and 112c, a metal material such as copper (Cu), aluminum (Al), silver (Ag), tin (Sn), gold (Au), nickel (Ni), lead (Pb), titanium (Ti), or alloys thereof may be used. The first to third conductor pattern layers 112a, 112b, and 112c may perform various functions depending on a design of a respective layer. For example, the first to third conductor pattern layers 112a, 112b, and 112c may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The signal (S) pattern may include various signals other than a ground (GND) pattern, a power (PWR) pattern, and the like, such as a data signal, for example. The ground (GND) pattern and the power (PWR) pattern may have the same pattern. The first to third conductor pattern layers 112a, 112b, and 112c may include a signal via pad, a ground via pad, or the like.

The first and second conductor vias 113a and 113b may electrically connect the first to third conductor pattern layers 112a, 112b, and 112c formed on different layers, and may accordingly form an electrical path in the frame 110. A material of the first and second conductor vias 113a and 113b may be a metal material. The first and second conductor vias 113a and 113b each may be a filled type completely filled with a metal material, or may be conformal type in which a metal material is formed along a side wall of a via hole. The first and second conductor vias 113a and 113b may have tapered shapes, tapered in the same direction as each other. When a hole for the first conductor via 113a is formed, a portion of the first conductor pattern layer 112a may work as a stopper, and thus, the first conductor via 113a may have a tapered shape in which a width of a bottom surface (adjacent the first conductor pattern layer 112a) may be smaller than a width of a top surface (adjacent the second conductor pattern layer 112b). In this case, the first conductor via 113a may be integrated with a pad pattern of the second conductor pattern layer 112b. Also, when a hole for the second conductor via 113b is formed, a portion of the second conductor pattern layer 112b may work as a stopper, and thus, the second conductor via 113b may have a tapered shape in which a width of a bottom surface may be smaller than a width of a top surface. In this case, the second conductor via 113b may be integrated with a pad pattern of the third conductor pattern layer 112c.

The descriptions of the other elements may be substantially the same as the descriptions described with reference to FIGS. 9 to 16, and thus, the detailed descriptions thereof will not be repeated.

Figure 18:
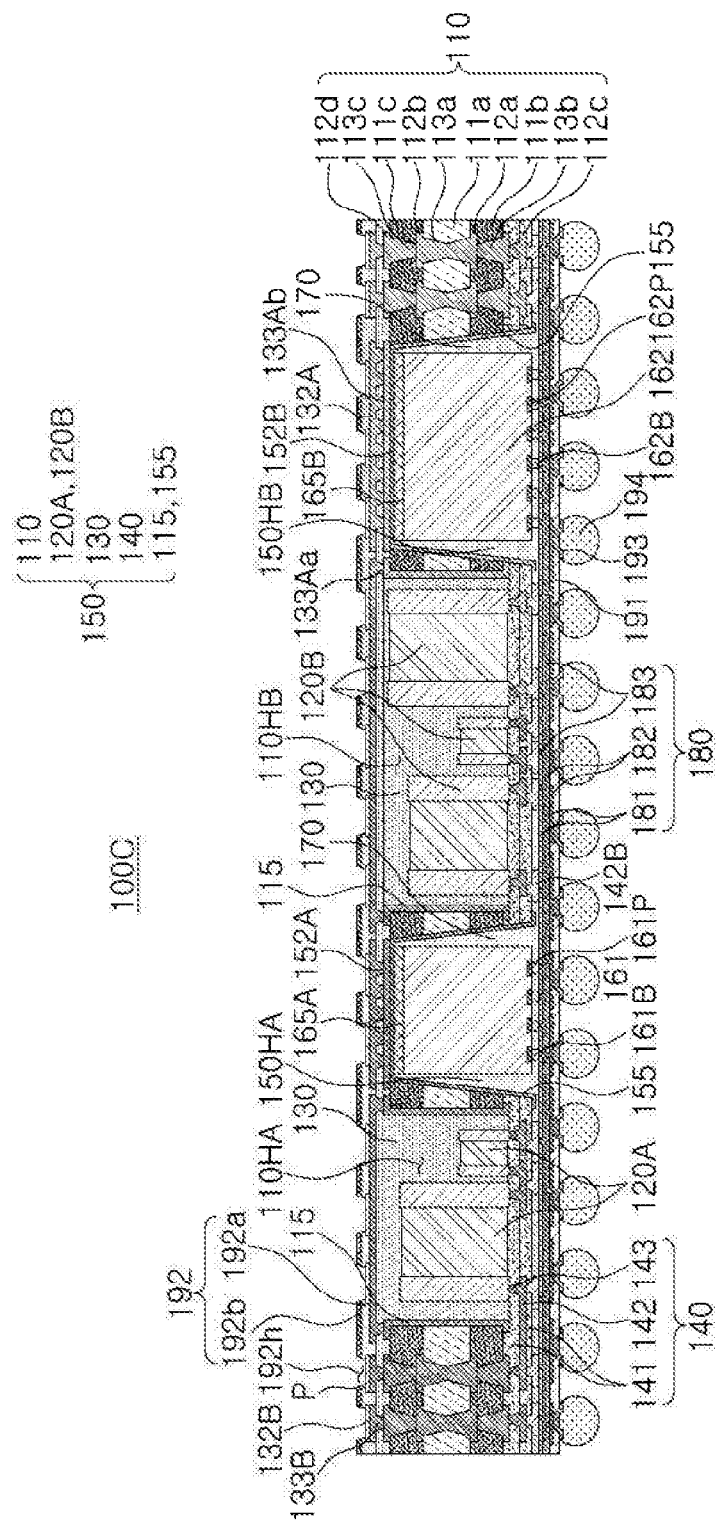
FIG. 18 is a schematic cross-sectional diagram illustrating another example of a package module.

FIG. 18 is a schematic cross-sectional diagram illustrating another example of a package module.

Referring to the diagram, in a package module 100C in the example embodiment, a frame 110 of a core structure 150 may include a first insulating layer 111a, a first conductor pattern layer 112a and a second conductor pattern layer 112b disposed on opposing surfaces of the first insulating layer 111a, a second insulating layer 111b and a third insulating layer 111c disposed on the opposing surfaces of the first insulating layer 111a and covering the first conductor pattern layer 112a and the second conductor pattern layer 112b, respectively, a third conductor pattern layer 111c disposed in a portion (or surface) of the second insulting layer 111b opposing a portion (or surface) in which the first conductor pattern layer 112a is buried, and a fourth conductor pattern layer 112d disposed in a portion (or surface) of the third insulating layer 111c opposing a portion (or surface) in which the second conductor pattern layer 112b is buried. The first and second conductor pattern layers 112a and 112b and the third and fourth conductor pattern layer 112c and 112d may be electrically connected to first and second connection pads 161P and 162P and first and second electronic components 120A and 120B. As the frame 110 includes a greater number of conductor pattern layers 112a, 112b, 112c, and 112d, a connection structure 180 may further be simplified. The first and second conductor pattern layers 112a and 112b and the third and fourth conductor pattern layer 112c and 112d may be electrically connected through first to third conductor vias 113a, 113b, and 113c penetrating the first to third insulating layers 111a, 111b, and 111c, respectively.

A thickness of the first insulating layer 111a may be greater than thicknesses of the second insulating layer 111b and the third insulating layer 111c. A thickness of the first insulating layer 111a may be relatively great to maintain stiffness, and the second insulating layer 111b and the third insulating layer 111c may be provided to form more numbers of the third and fourth conductor pattern layers 112c and 112d. Similarly, the first conductor via 113a penetrating the first insulating layer 111a may have an average diameter greater than average diameters of the second and third conductor vias 113b and 113c penetrating the second and third insulating layers 111b and 111c. The first conductor via 113a may have a cylindrical shape or a sandglass shape. The second and third conductor vias 113b and 113c may have tapered shapes, tapered in opposite directions. A thickness of each of the first to fourth conductor pattern layers 112a, 112b, 112c, and 112d may be greater than a thickness of each of the redistribution layers 182.

The descriptions of the other elements may be substantially the same as the descriptions described with reference to FIGS. 9 to 17, and thus, the detailed descriptions thereof will not be repeated.

According to the aforementioned example embodiments, a package module which may be reduced in size and miniaturized even while including a plurality of chips and components, which may effectively prevent electromagnetic interference between different types of blocks when a metal layer, and the like, is appropriately included in a basic structure in the example embodiments, and which may have an improved heat dissipation effect may be provided.

In the example embodiments, the expression "coplanar" may indicate that elements may be positioned on the exact same level, but may also indicate that elements may be substantially positioned on the same level as a result of a grinding process, and the like.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the example embodiments is not particularly limited to the above terms.

While the example embodiments have been shown and described above, it will be apparent to those skilled in the art that modifications and variations could be made without departing from the scope of the present invention as defined by the appended claims.

What is claimed is:

1. A package module, comprising:
    a core structure including a frame having a penetrating portion, an electronic component disposed in the penetrating portion, and an insulating material covering at least a portion of each of the frame and the electronic component and filling at least a portion of the penetrating portion, and the core structure further having a recessed portion in which a stopper layer is disposed on a bottom surface of the recessed portion;
    a semiconductor chip having an active surface on which a connection pad is disposed and an inactive surface opposing the active surface, and disposed in the recessed portion such that the inactive surface faces the stopper layer;
    an encapsulant covering at least a portion of each of the core structure and the semiconductor chip, and filling at least a portion of the recessed portion; and
    an interconnect structure disposed on the core structure and the active surface of the semiconductor chip, and including a redistribution layer electrically connected to the electronic component and the connection pad,
    wherein the core structure further includes a first metal layer disposed on a side wall of the penetrating portion, and a second metal layer disposed on a side wall of the recessed portion, and
    wherein the second metal layer extends to the bottom surface of the recessed portion.

2. The package module of claim 1,
    wherein the stopper layer includes a metal material, and
    wherein the second metal layer is interposed between the first metal layer and the semiconductor chip along a first direction parallel to the active surface of the semiconductor chip.

3. The package module of claim 2,
    wherein the second metal layer covers at least a portion of the stopper layer.

4. The package module of claim 2,
    wherein the first metal layer extends from the side wall of the penetrating portion to at least one surface of the frame, and
    wherein the core structure further includes a backside metal layer disposed on a portion of the insulating material facing away from the interconnect structure, a first metal via penetrating the insulating material and connecting the backside metal layer to the first metal layer, and a second metal via penetrating the insulating material and connecting the backside metal layer to the stopper layer.

5. The package module of claim 4, wherein the backside metal layer overlaps an upper region of the electronic component and the inactive surface of the semiconductor chip on the insulating material.

6. The package module of claim 1, wherein the core structure further includes a wiring member disposed on portions of the frame and the electronic component facing with the interconnect structure, and including a wiring layer electrically connected to the electronic component.

7. The package module of claim 6, wherein the active surface of the semiconductor chip is closer to the interconnect structure than a surface of the electronic component that contacts the wiring member is to the interconnect structure.

8. The package module of claim 6, further comprising:
    a first connection member electrically connecting the connection pad to the redistribution layer; and
    a second connection member electrically connecting the wiring layer to the redistribution layer,
    wherein the encapsulant covers side surfaces of the first and second connection members.

9. The package module of claim 8, wherein a surface of each of the first and second connection members in contact with the interconnect structure is coplanar with a surface of the encapsulant that is in contact with the interconnect structure.

10. The package module of claim 9, wherein the interconnect structure includes an insulating layer disposed on the coplanar surfaces of the first and second connection members and the encapsulant, first and second connection vias penetrating the insulating layer and respectively in contact with the first and second connection members, and the redistribution layer disposed on the insulating layer and electrically connected to the first and second connection members through the first and second connection vias.

11. The package module of claim 1,
    wherein the frame includes a plurality of conductor pattern layers electrically connected to each other, and
    wherein the plurality of conductor pattern layers are electrically connected to the redistribution layer.

12. The package module of claim 11, wherein the core structure further includes a backside conductor pattern layer disposed on a surface of the insulating material facing away from the interconnect structure, and a backside conductor via penetrating the insulating material and electrically connecting the backside conductor pattern layer to the plurality of conductor pattern layers.

13. The package module of claim 11,
    wherein the frame includes a first insulating layer, a first conductor pattern layer embedded in the first insulating layer such that one surface of the first conductor pattern layer is exposed, a second conductor pattern layer disposed on a first surface of the first insulating layer opposing a second surface in which the first conductor pattern layer is embedded, a second insulating layer disposed on the first surface of the first insulating layer and covering the second conductor pattern layer, and a third conductor pattern layer disposed on a surface of the second insulating layer opposing another surface in which the second conductor pattern layer is embedded, and
    wherein the plurality of conductor pattern layers include the first, second, and third conductor pattern layers.

14. The package module of claim 11,
wherein the frame includes a first insulating layer, first and second conductor pattern layers disposed on opposing surfaces of the first insulating layer, second and third insulating layers disposed on the opposing surfaces of the first insulating layer, respectively, and covering the first and second conductor pattern layers, respectively, a third conductor pattern layer disposed on a surface of the second insulating layer opposing a surface in which the first conductor pattern layer is embedded, and a fourth conductor pattern layer disposed on a surface of the third insulating layer opposing a surface in which the second conductor pattern layer is embedded, and
wherein the plurality of conductor pattern layers include the first, second, third, and fourth conductor pattern layers.

15. The package module of claim 1,
wherein the penetrating portion includes first and second penetrating portions spaced apart from each other,
wherein the electronic component includes first and second electronic components disposed in the first and second penetrating portions, respectively,
wherein the recessed portion includes first and second recessed portions spaced apart from each other,
wherein the stopper layer includes first and second stopper layers disposed on bottom surfaces of the first and second recessed portions, respectively, and
wherein the semiconductor chip includes first and second semiconductor chips respectively disposed in the first and second recessed portions such that inactive surfaces of the first and second semiconductor chips face the first and second stopper layers, respectively.

16. The package module of claim 15,
wherein the first semiconductor chip includes a power management integrated circuit,
wherein the second semiconductor chip includes a radio frequency integrated circuit, and
wherein the first and second electronic components each include at least one of a capacitor and an inductor.

17. A package module comprising:
a frame having opposing first and second surfaces, a recessed portion open to the first surface and extending into the frame, a conductor pattern layer disposed on the second surface, and a conductive stopper layer forming a bottom surface of the recessed portion and substantially coplanar with the conductor pattern layer disposed on the second surface;
a semiconductor chip having an active surface on which a connection pad is disposed and an inactive surface opposing the active surface, and disposed in the recessed portion such that the inactive surface faces the conductive stopper layer;
a first metal layer disposed on a side wall of a penetrating portion of the frame and contacting the conductive stopper layer;
a second metal layer disposed on a side wall of the recessed portion and extending to the bottom surface of the recessed portion; and
an interconnect structure disposed on the frame and the active surface of the semiconductor chip, and including a redistribution layer electrically connected to the connection pad.

18. The package module of claim 17, wherein the penetrating portion extends through the frame from the first surface to the second surface, the package module further comprising:
an electronic component disposed in the penetrating portion and electrically connected to the redistribution layer of the interconnect structure, and
wherein the electronic component, the first metal layer, the second metal layer and the semiconductor chip are sequentially arranged along a first direction parallel to the active surface of the semiconductor chip.

19. The package module of claim 18, further comprising:
an insulating material covering at least a portion of each of the frame, the electronic component, the conductor pattern layer, and the conductive stopper layer, and filling at least a portion of the penetrating portion;
a backside metal layer disposed on a portion of the insulating material covering the conductor pattern layer and the conductive stopper layer;
a first metal via penetrating the insulating material and connecting the backside metal layer to the conductor pattern layer, and a second metal via penetrating the insulating material and connecting the backside metal layer to the conductive stopper layer.

20. The package module of claim 17, wherein the active surface of the semiconductor chip is closer to the interconnect structure than the frame is to the interconnect structure, and
the package module further comprises a wiring member having an insulating layer, a wiring layer, and a wiring via, the wiring member being disposed between the first surface of the frame and the interconnect structure.

* * * * *